US012777776B2

(12) United States Patent
Tanaka et al.

(10) Patent No.: US 12,777,776 B2
(45) Date of Patent: Oct. 27, 2026

(54) DISPLAY DEVICE AND METHOD OF MANUFACTURING DISPLAY DEVICE

(71) Applicant: Samsung Display Co., LTD., Yongin-si (KR)

(72) Inventors: Tetsuhiro Tanaka, Yongin-si (KR); Yeon Keon Moon, Yongin-si (KR); Seok Hwan Bang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 359 days.

(21) Appl. No.: 18/543,846

(22) Filed: Dec. 18, 2023

(65) Prior Publication Data

US 2024/0414939 A1 Dec. 12, 2024

(30) Foreign Application Priority Data

Jun. 8, 2023 (KR) ........................ 10-2023-0073682

(51) Int. Cl.
*H10K 59/12* (2023.01)
*H10K 59/121* (2023.01)

(52) U.S. Cl.
CPC ..... *H10K 59/1213* (2023.02); *H10K 59/1201* (2023.02)

(58) Field of Classification Search
CPC ........... H10K 59/1213; H10K 59/1201; H10K 59/131; H10K 59/123; H10D 30/6719;
(Continued)

(56) References Cited

U.S. PATENT DOCUMENTS 11,935,471 B2 * 3/2024 Kim ..................... G09G 3/3233
12,217,700 B2 * 2/2025 Kim ......................... G09G 3/20
(Continued)

FOREIGN PATENT DOCUMENTS

KR 10-2017-0081082 7/2017
KR 10-2023-0060563 5/2023

OTHER PUBLICATIONS

"SEM, EDX and SCM evaluation of IGZO-TFT", Toray Research Center, Inc., Aug. 31, 2020, https://www.toray-research.co.jp/en/technicaldata/pdf/TechData_P02195.pdf.
(Continued)

*Primary Examiner* — Tuyen K Vo
(74) *Attorney, Agent, or Firm* — F. CHAU & ASSOCIATES, LLC

(57) ABSTRACT

A display device includes a pixel circuit disposed on a base layer and including a transistor including a source electrode, a drain electrode, a gate electrode, and a semiconductor layer, and a light emitting element electrically connected to the pixel circuit. The semiconductor layer includes a low concentration area, a high concentration area, and a slope concentration area between the low concentration area and the high concentration area, which are divided based on a concentration of a carrier and are spaced apart from each other in a length direction of the base layer. The low concentration area and a portion of the slope concentration area form a channel area, and form a source area and a drain area including the high concentration area and at least another portion of the slope concentration area. In the slope concentration area, the semiconductor layer satisfies an equation.

20 Claims, 15 Drawing Sheets

(58) Field of Classification Search
CPC .. H10D 30/6721; H10D 86/60; H10D 86/021; H10D 86/441; G09G 3/32; H10H 29/142; H10W 90/00
See application file for complete search history.

(56) References Cited

U.S. PATENT DOCUMENTS

| | | | | |
|---|---|---|---|---|
| 12,236,876 | B2 * | 2/2025 | Morita | G09G 3/3233 |
| 2021/0201782 | A1 * | 7/2021 | Jang | G09G 3/3233 |
| 2023/0129192 | A1 | 4/2023 | In | |
| 2023/0360604 | A1 * | 11/2023 | Bong | G09G 3/3266 |
| 2024/0062712 | A1 * | 2/2024 | Kim | G09G 3/3233 |
| 2024/0257689 | A1 * | 8/2024 | Jung | G09G 3/2007 |
| 2024/0412687 | A1 * | 12/2024 | Kusunoki | G09F 9/30 |
| 2025/0166561 | A1 * | 5/2025 | Kwon | G09G 3/3208 |

OTHER PUBLICATIONS

"[SCM] Scanning Capacitance Microscopy / [SNDM]Scanning Nonlinear Dielectric Microscopy", Foundation for Promotion of Material Science and Technology of Japan, 2015, https://www.mst.or.jp/Portals/0/en/en_scm_sndm.html.

* cited by examiner

ACT(SA): LDA, HDA, SLOA
HDA: HDA1, HDA2
SLOA: SLOA1, SLOA2
SDA: SEA, DEA

ACT(SA): LDA, HDA, SLOA
HDA: HDA1, HDA2
SLOA: SLOA1, SLOA2

ACT'(SA'): LDA', HDA', SLOA'
HDA': HDA1', HDA2'
SLOA': SLOA1', SLOA2'

ACT(SA): LDA, HDA, SLOA
HDA: HDA1, HDA2
SLOA: SLOA1, SLOA2

DISPLAY DEVICE AND METHOD OF MANUFACTURING DISPLAY DEVICE

CROSS-REFERENCE TO RELATED APPLICATION(S)

This application claims priority to and benefits of Korean patent application No. 10-2023-0073682 under 35 U.S.C. § 119, filed on Jun. 8, 2023, in the Korean Intellectual Property Office, the entire contents of which are incorporated herein by reference.

BACKGROUND

1. Technical Field

The disclosure relates to a display device and a method of manufacturing the display device.

2. Description of the Related Art

Recently, as interest in information display is increasing, research and development for a display device are continuously being conducted. The display device may include a light emitting element capable of emitting light and a pixel circuit for driving the light emitting element.

In order to implement layers including the pixel circuit, two or more conductive structures may be formed. Experimentally, two or more conductive structures may electrically interfere with each other. For example, an unintended parasitic capacitance adjacent to some circuit elements may be formed.

In case that the parasitic capacitance is formed, an operation characteristic of a circuit element including a driving transistor may be changed. In case that the operation characteristic of the circuit element is changed, a risk that the pixel circuit operates abnormally (change of a driving current, or the like) exists.

Accordingly, a display device including a structure in which interference between conductive structures is reduced by including a parasitic capacitance, operation reliability is improved, and display quality is improved is required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure relates to a display device and a method of manufacturing the display device in which a carrier concentration gradient in a semiconductor structure of a transistor included in a pixel circuit is closely controlled, thereby improving reliability of an electrical signal and reducing a risk that display quality is damaged.

According to an embodiment a display device may include a pixel circuit disposed on a base layer and including a transistor, the transistor including a source electrode, a drain electrode, a gate electrode, and a semiconductor layer, and a light emitting element electrically connected to the pixel circuit. The semiconductor layer may include a low concentration area, a high concentration area, and a slope concentration area between the low concentration area and the high concentration area which are divided based on a concentration of a carrier and are spaced apart from each other in a length direction of the base layer. The low concentration area and a portion of the slope concentration area may form a channel area, and form a source area and a drain area including the high concentration area and at least another portion of the slope concentration area. The semiconductor layer in the slope concentration area may satisfy Equation 1:

$$6.6 \leq \frac{\Delta Y}{\Delta X} \leq 11\ [1/(\text{cm}^3 \cdot \mu\text{m})] \quad \text{[Equation 1]}$$

Where, $\Delta X$ is a length change amount [μm] in a length direction of the semiconductor layer in the slope concentration area, and $\Delta Y$ is a concentration change amount [1/(cm$^3$)] of the carrier in the length change amount in the slope concentration area.

According to an embodiment, the semiconductor layer may be electrically connected to the source electrode in the source area, may be electrically connected to the drain electrode in the drain area, and may overlap the gate electrode in the slope concentration area in a plan view.

According to an embodiment, at least a portion of the semiconductor layer may not overlap the gate electrode in the source area and the drain area in a plan view. The semiconductor layer may entirely overlap the gate electrode in the slope concentration area in a plan view.

According to an embodiment, the transistor may include a switching transistor.

According to an embodiment, the semiconductor layer may include a thin film transistor including an oxide semiconductor.

According to an embodiment, the oxide semiconductor may include In-Ga-Zn-Oxide (IGZO).

According to an embodiment, the semiconductor layer in the slope concentration area may satisfy Equation 2:

$$8600 \leq \frac{dC}{dV} \leq 10000 \quad \text{[Equation 2]}$$

Where, $$\frac{dC}{dV}$$

is a differential value defined based on a capacitance change amount according to a change amount of a voltage measured in the slope concentration area of the semiconductor layer using a scanning capacitance microscope.

According to an embodiment, a length of the slope concentration area in the length direction may be in a range of about 0.05 μm to about 0.5 μm.

According to an embodiment, a display device may include a pixel circuit disposed on a base layer and including a transistor, the transistor including a source electrode, a drain electrode, and a semiconductor layer, and a light emitting element electrically connected to the pixel circuit. The semiconductor layer may include a low concentration area, a high concentration area, and a slope concentration area between the low concentration area and the high concentration area which are divided based on a concentration of a carrier and are spaced apart from each other in a length direction of the base layer. The low concentration area and a portion of the slope concentration area may form a channel area, and form a source area and a drain area including the high concentration area and at least another portion the slope concentration area. The semiconductor layer in the slope concentration area may satisfy Equation 2:

$$8600 \leq \frac{dC}{dV} \leq 10000 \quad \text{[Equation 2]}$$

Where $$\frac{dC}{dV}$$

is a differential value defined based on a capacitance change amount according to a change amount of a voltage measured in the slope concentration area of the semiconductor layer using a scanning capacitance microscope.

According to an embodiment, a method of manufacturing a display device may include patterning a base semiconductor layer on a base layer, and forming semiconductor areas in the base semiconductor layer. The forming of the semiconductor areas may include performing a process for defining the semiconductor areas, analyzing a concentration of a carrier formed in the base semiconductor layer using a scanning capacitance microscope, and determining whether the concentration of the carrier satisfies a selectable reference, based on information on the analyzed concentration of the carrier. The forming of the semiconductor areas may further include performing an additional process for defining the semiconductor areas in case that the concentration of the carrier does not satisfy the selectable reference, and additionally performing analyzing after the performing of the additional process.

According to an embodiment, the analyzing of the concentration of the carrier may include measuring $$\frac{dC}{dV},$$

by the scanning capacitance microscope, for each area of the base semiconductor layer, and $$\frac{dC}{dV}$$

may be obtained based on data measured for each area of the base semiconductor layer, and may be a differential value defined based on a capacitance change amount according to a change amount of a voltage.

According to an embodiment, the performing of the process and the performing of the additional process may include performing an annealing process. The annealing process may be performed at a process temperature in a range of about 300° C. to about 650° C.

According to an embodiment, the base semiconductor layer may include an oxide semiconductor.

According to an embodiment, in determining, in case that the concentration of the carrier satisfies the selectable reference, patterning a source electrode and a drain electrode may be performed without performing the additional process.

According to an embodiment, the performing of the process may include providing a dopant to the base semiconductor layer to provide a pre-updated-semiconductor layer. The pre-updated-semiconductor layer may include a pre-updated-low concentration area, a pre-updated-high concentration area, and a pre-updated-slope concentration area between the pre-updated-low concentration area and the pre-updated-high concentration area which are divided based on the concentration of the carrier and are spaced apart in a length direction of the base layer.

According to an embodiment, the selectable reference may be defined in the pre-updated-slope concentration area, and may include whether a slope indicating a change in the concentration of the carrier according to a change in a length of the pre-updated-semiconductor layer is greater than or equal to a selectable reference slope.

According to an embodiment, the reference slope may be about 6.6 or less.

According to an embodiment, the selectable reference may include whether a length of the pre-updated-slope concentration area in the length direction is less than or equal to a selectable reference length.

According to an embodiment, the reference length may be about 0.5 μm or less.

According to an embodiment, the method may further include providing a semiconductor layer satisfying the selectable reference. The semiconductor layer may include a low concentration area, a high concentration area, and a slope concentration area between the low concentration area and the high concentration area which are divided based on the concentration of the carrier and are spaced apart from each other in a length direction of the base layer. The low concentration area and a portion of the slope concentration area may form a channel area, and form a source area and a drain area including the high concentration area and at least another portion of the slope concentration area. The semiconductor layer in the slope concentration area may satisfy Equation 1:

$$6.6 \leq \frac{\Delta Y}{\Delta X} \leq 11\ [1/(\mathrm{cm}^3 \cdot \mu\mathrm{m})] \quad \text{[Equation 1]}$$

Where ΔX is a length change amount [μm] in the length direction of the semiconductor layer in the slope concentration area, and ΔY is a concentration change amount [1/($cm^3$)] of the carrier in the length change amount in the slope concentration area.

According to an embodiment, a display device and a method of manufacturing the display device in which a carrier concentration gradient in a semiconductor structure of a transistor included in a pixel circuit is closely controlled, thereby improving reliability of an electrical signal and reducing a risk that display quality is damaged may be provided.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
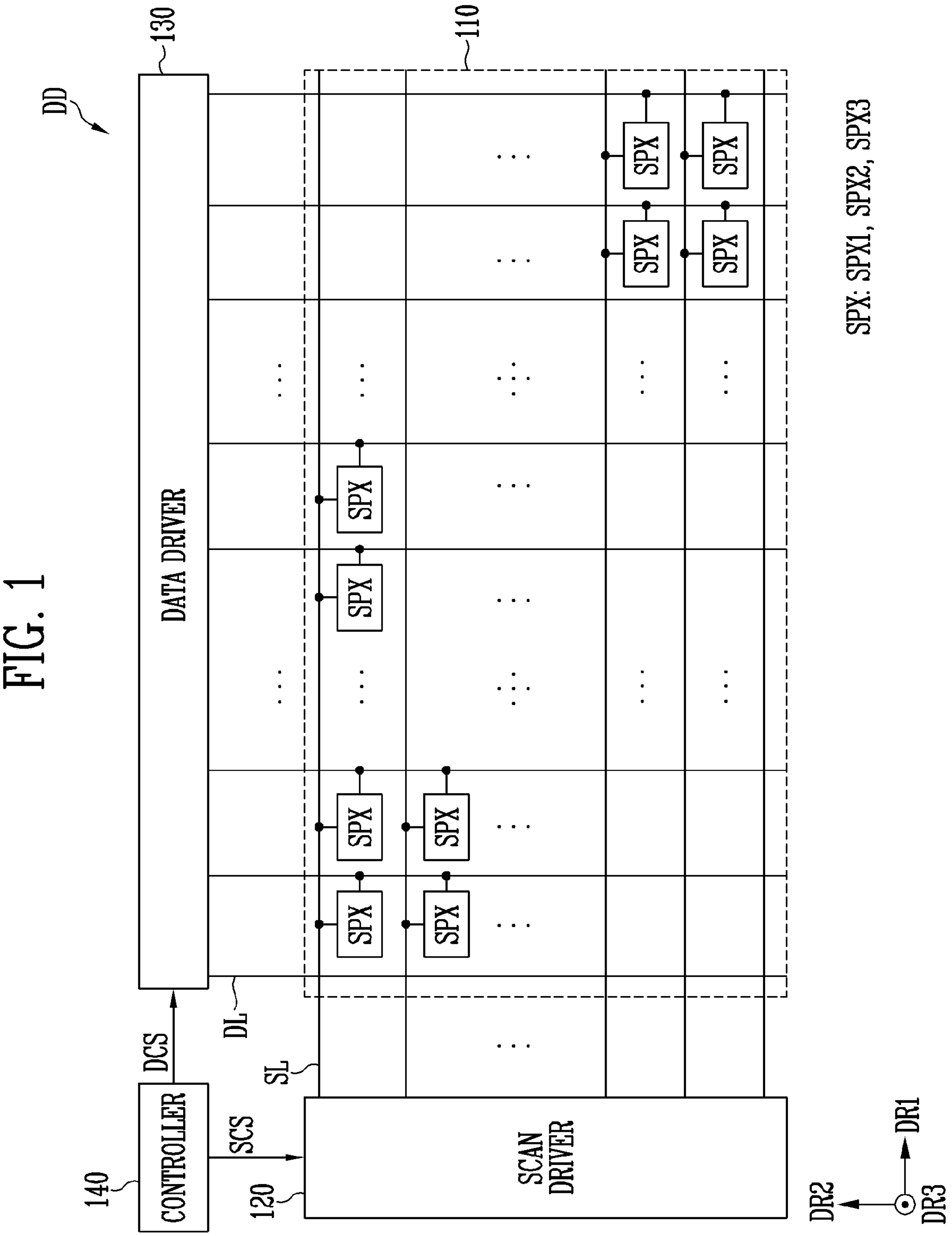
FIG. 1 is a block diagram illustrating a display device according to an embodiment.

The disclosure may be modified in various manners and have various forms. Therefore, example embodiments will be illustrated in the drawings and will be described in detail in the specification. However, it should be understood that the disclosure is not intended to be limited to the disclosed forms, and the disclosure includes all modifications, equivalents, and substitutions within the spirit and technical scope of the disclosure.

In the drawings, sizes, thicknesses, ratios, and dimensions of the elements may be exaggerated for ease of description and for clarity. Like numbers refer to like elements throughout.

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It should be understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Where a portion of a layer, a layer, an area, a plate, or the like is referred to as being "on" another portion, it includes not only a case where the portion is "directly on" another portion, but also a case where there is further another portion between the portion and the other portion. In the specification, when a portion of a layer, a layer, an area, a plate, or the like is formed on another portion, a forming direction is not limited to an upper direction but includes forming the portion on a side surface or in a lower direction. On the contrary, when a portion of a layer, a layer, an area, a plate, or the like is formed "under" another portion, this includes not only a case where the portion is "directly beneath" another portion but also a case where there is further another portion between the portion and the other portion.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The disclosure relates to a display device and a method of manufacturing the display device. Hereinafter, a display device and a method of manufacturing the display device according to an embodiment is described with reference to the accompanying drawings.

A display device DD according to an embodiment is described with reference to FIG. 1. FIG. 1 is a block diagram illustrating a display device according to an embodiment.

The display device DD is configured to emit light. The display device DD may be an electronic device using a light emitting element LD (refer to FIG. 2) as a light source. According to an embodiment, the display device DD may include a pixel unit 110, a scan driver 120, a data driver 130, and a controller 140.

The pixel unit 110 may include sub-pixels SPX connected to a scan line SL and a data line DL. According to an embodiment, one or more of the sub-pixels SPX may form (for example, configure) a pixel unit. Each of the sub-pixels SPX may be one of first to third sub-pixels SPX1, SPX2, and SPX3. For example, the sub-pixels SPX may include the first sub-pixel SPX1 emitting light of a first color (for example, red), the second sub-pixel SPX2 emitting light of a second color (for example, green), and the third sub-pixel SPX3 emitting light of a third color (for example, blue). However, the disclosure is not limited to the above-described example.

The scan driver 120 may be disposed on one side or a side of the pixel unit 110. The scan driver 120 may receive a first control signal SCS from the controller 140. The scan driver 120 may provide a scan signal GW (refer to FIG. 3) to the sub-pixel SPX. The scan driver 120 may supply the scan signal GW to the scan lines SL in response to the first control signal SCS.

The first control signal SCS may be a signal for controlling a driving timing of the scan driver 120. The first control signal SCS may include a scan start signal and clock signals for the scan signal GW. The scan signal GW may be set to a gate-on level corresponding to a type of a transistor (for example, a second transistor T2 (refer to FIG. 3) to which a corresponding scan signal GW is supplied.

The data driver 130 may be disposed on one side or a side of the pixel unit 110. The data driver 130 may receive a second control signal DCS from the controller 140. The data driver 130 may provide a data signal DATA (refer to FIG. 3) to the sub-pixel SPX. The data driver 130 may supply the data signal DATA to the data line DL in response to the second control signal DCS. For example, the second control signal DCS may be provided to the sub-pixel SPX through the data line DL. The second control signal DCS may be a signal for controlling a driving timing of the data driver 130.

A portion of the scan line SL may extend in a first direction DR1, and may be electrically connected to the sub-pixel SPX of a corresponding pixel row through another portion of the scan line SL extending in a second direction DR2. Accordingly, the scan line SL may supply the scan signal GW to the corresponding sub-pixel SPX.

The data line DL may extend along a pixel column (for example, in the second direction DR2) and may be electrically connected to the sub-pixel SPX. The data line DL may supply the data signal DATA to the connected sub-pixel SPX.

Here, a pixel row direction may be a horizontal direction and may mean the first direction DR1. The pixel column direction may be a vertical direction and may mean the second direction DR2. However, the disclosure is not limited thereto.

In FIG. 1, the scan driver 120, the data driver 130, and the controller 140 are shown separately, but at least a portion of the scan driver 120, the data driver 130, and the controller 140 may be integrated into one module or integrated circuit (IC) chip.

Figure 2:
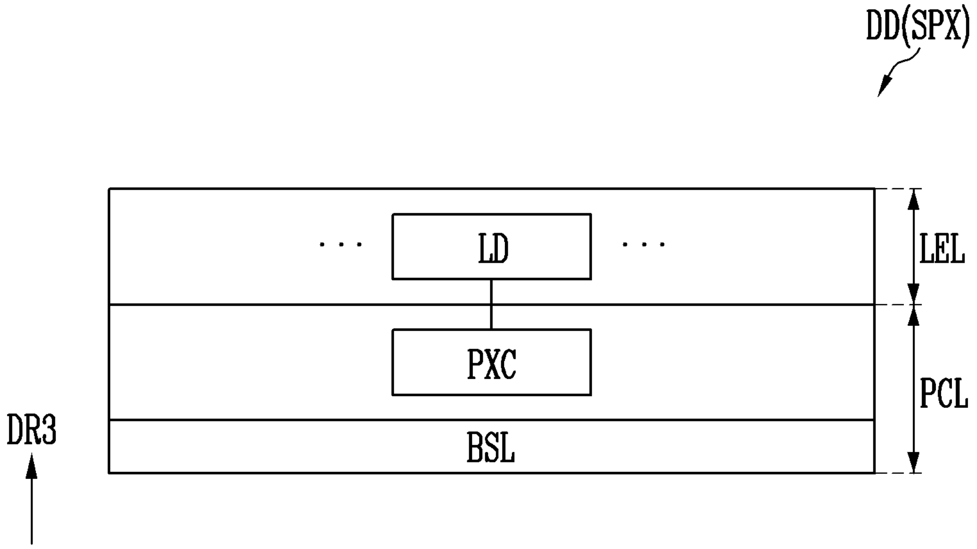
FIG. 2 is a schematic cross-sectional view illustrating a display device according to an embodiment.

A cross-sectional structure of a display device DD (for example, a sub-pixel SPX formed on a base layer BSL) according to an embodiment is described with reference to FIG. 2. FIG. 2 is a schematic cross-sectional view illustrating a display device according to an embodiment.

Referring to FIG. 2, the display device DD may include a pixel-circuit layer PCL and a light-emitting-element layer LEL.

The pixel-circuit layer PCL may be a layer including a pixel circuit PXC for driving the light emitting elements LD. The pixel-circuit layer PCL may include a base layer BSL, conductive layers for forming pixel circuits, and insulating layers disposed on the conductive layers.

The base layer BSL may form (or configure) a base surface of the display device DD. The base layer BSL may include a rigid or flexible substrate or film. For example, the base layer BSL may be a glass substrate and may be a base film including an organic material. A material or a configuration material of the base layer BSL is not limited to a specific example, and the base layer BSL may include various materials.

The light-emitting-element layer LEL may be disposed on the pixel-circuit layer PCL. According to an embodiment, the light-emitting-element layer LEL may include the light emitting element LD. The light emitting element LD may be an inorganic light emitting diode including an inorganic semiconductor, and the light emitting element LD may be an organic light emitting diode (OLED) including an organic material. However, the disclosure is not limited to specific examples.

The light emitting element LD may be electrically connected to the pixel circuit PXC. The light emitting element LD may emit light based on an electrical signal (for example, an intensity of a current) provided from the pixel circuit PXC.

Figure 3:
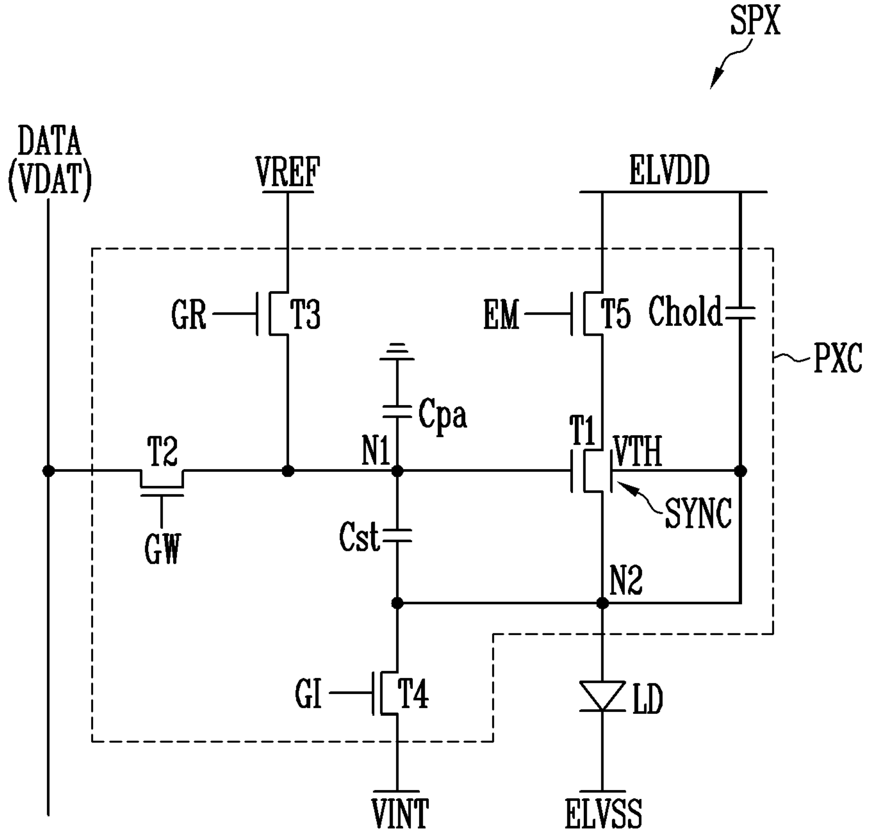
FIG. 3 is a schematic diagram illustrating a pixel circuit according to an embodiment.

A pixel circuit PXC according to an embodiment is described with reference to FIG. 3. FIG. 3 is a schematic diagram illustrating a pixel circuit according to an embodiment.

According to an embodiment, the sub-pixel SPX may include the pixel circuit PXC. The pixel circuit PXC may include a first transistor T1, a second transistor T2, a storage capacitor Cst, a third transistor T3, a fourth transistor T4, a fifth transistor T5, and a holding capacitor Chold.

According to an embodiment, the first to seventh transistors T1 to T5 may be implemented as N-type metal oxide semiconductor (NMOS) transistors. However, the disclosure is not necessarily limited thereto. In an embodiment, a portion or all of the first to seventh transistors T1 to T5 may be implemented as P-type metal oxide semiconductor (PMOS) transistors. Hereinafter, the disclosure is described based on an embodiment in which the first to seventh transistors T1 to T5 are implemented as NMOS transistors.

The first transistor T1 may provide a driving current for the light emitting element LD to emit light based on a voltage between the first node N1 and the second node N2 (for example, a voltage stored in the storage capacitor Cst). According to an embodiment, the first node N1 may be a gate node electrically connected to a gate electrode of the first transistor T1. According to an embodiment, the second node N2 may be a node connected to a source electrode of the first transistor T1. The first transistor T1 may be a driving transistor for generating the driving current.

According to an embodiment, the first transistor T1 may include a first gate electrode electrically connected to the first node N1, a drain electrode electrically connected to the fifth transistor T5, the source electrode electrically connected to the second node N2, and a second gate electrode SYNC electrically connected to the holding capacitor Chold. The first transistor T1 may have a double gate structure including the first gate electrode and the second gate electrode. According to an embodiment, the second gate electrode SYNC of the first transistor T1 may be a sync conductive layer. According to an embodiment, the first transistor T1 may include the second gate electrode SYNC, the second gate electrode SYNC may be maintained at a substantially uniform voltage by the holding capacitor Chold, and thus a driving characteristic of the transistor T1 may be improved. For example, a drain-source current of the first transistor T1 according to a drain-source voltage of the first transistor T1 may be provided more uniformly.

The second transistor T2 may provide (for example, apply) the data voltage VDAT of the data line DL to the first node N1 in response to the scan signal GW. The second transistor T2 may be a switching transistor. The second transistor T2 may transfer a voltage (for example, the data signal DATA) of the data line DL. According to an embodiment, the second transistor T2 may include a gate electrode receiving the scan signal GW, a drain electrode electrically connected to the data line DL, and a source electrode electrically connected to the first node N1.

The third transistor T3 may provide (for example, apply) a reference voltage VREF to the first node N1 in response to a reset signal GR. The third transistor T3 may be a reset transistor for providing (for example, applying) the reference voltage VREF to the first node N1. According to an embodiment, the third transistor T3 may include a gate electrode receiving the reset signal GR, a drain electrode electrically connected to a line of the reference voltage VREF, and a source electrode electrically connected to the first node N1.

The storage capacitor Cst may store the data voltage VDAT transferred from the data line DL through the second transistor T2. The storage capacitor Cst may be electrically connected between the first node N1 and the second node N2. According to an embodiment, the storage capacitor Cst may include a first electrode electrically connected to the first node N1 and a second electrode electrically connected to the second node N2.

The fourth transistor T4 may provide (for example, apply) an initialization voltage VINT to the second node N2 in response to an initialization signal GI. The fourth transistor T4 may be an initialization transistor for initializing the second node N2. According to an embodiment, the fourth transistor T4 may include a gate electrode receiving the initialization signal GI, a drain electrode connected to a line of the initialization voltage VINT, and a source electrode connected to the second node N2.

The fifth transistor T5 may electrically connect a line of a first power voltage ELVDD to the drain electrode of the first transistor T1 in response to an emission signal EM. The fifth transistor T5 may be a light emitting transistor for forming a path of the driving current from the line of the first power voltage ELVDD to a line of a second power voltage ELVSS. According to an embodiment, the fifth transistor T5 may include a gate electrode receiving the emission signal EM, a drain electrode electrically connected to the line of the first power voltage ELVDD, and a source electrode electrically connected to the drain electrode of the first transistor T1.

The holding capacitor Chold may be a capacitor for maintaining a voltage of the second node N2. The holding capacitor Chold may be electrically connected to the second node N2 through the sixth transistor T6. For example, the holding capacitor Chold may be electrically connected between the line of the first power voltage ELVDD and the second node N2. According to an embodiment, the holding capacitor Chold may include a first electrode connected to the line of the first power voltage ELVDD, and a second electrode electrically connected to the second gate electrode SYNC.

The light emitting element LD may emit light based on the driving current provided from the first transistor T1. According to an embodiment, the light emitting element LD may include an anode electrode electrically connected to the second node N2 and a cathode electrode electrically connected to the line of the second power voltage ELVSS.

Experimentally, a concern that a parasitic capacitance Cpa may be formed in an area adjacent to the second transistor T2 (for example, the switching transistor) may exist. For example, the parasitic capacitance Cpa may occur as a source area and a drain area formed in a semiconductor layer ACT included in each transistor are excessively adjacent to the gate electrode. In case that the parasitic capacitance Cpa is formed, compensation force for a threshold voltage VTH (refer to FIG. 4) may be reduced, and thus a stain or the like may be recognized on the display device DD, and thus a concern that display quality may be deteriorated may occur.

According to the embodiment, a structure capable of minimizing the occurrence of the parasitic capacitance Cpa may be implemented, and thus a display device DD having improved display quality and preventing recognition of a stain or the like may be manufactured. Details regarding this are described later. As the parasitic capacitance Cpa is generated, an aspect in which the driving current of the first transistor T1 (for example, the driving transistor) is changed differently from an intended range is described later with reference to FIG. 4, and a reason why the capacitance Cpa is generated is described later with reference to the drawings after FIG. 5.

An operation in which the sub-pixel SPX is driven is described with reference to FIG. 4. An effect on a generated electrical signal in case that the parasitic capacitance Cpa that may be generated adjacent to the switching transistor (for example, the second transistor T2) is formed is described.

Figure 4:
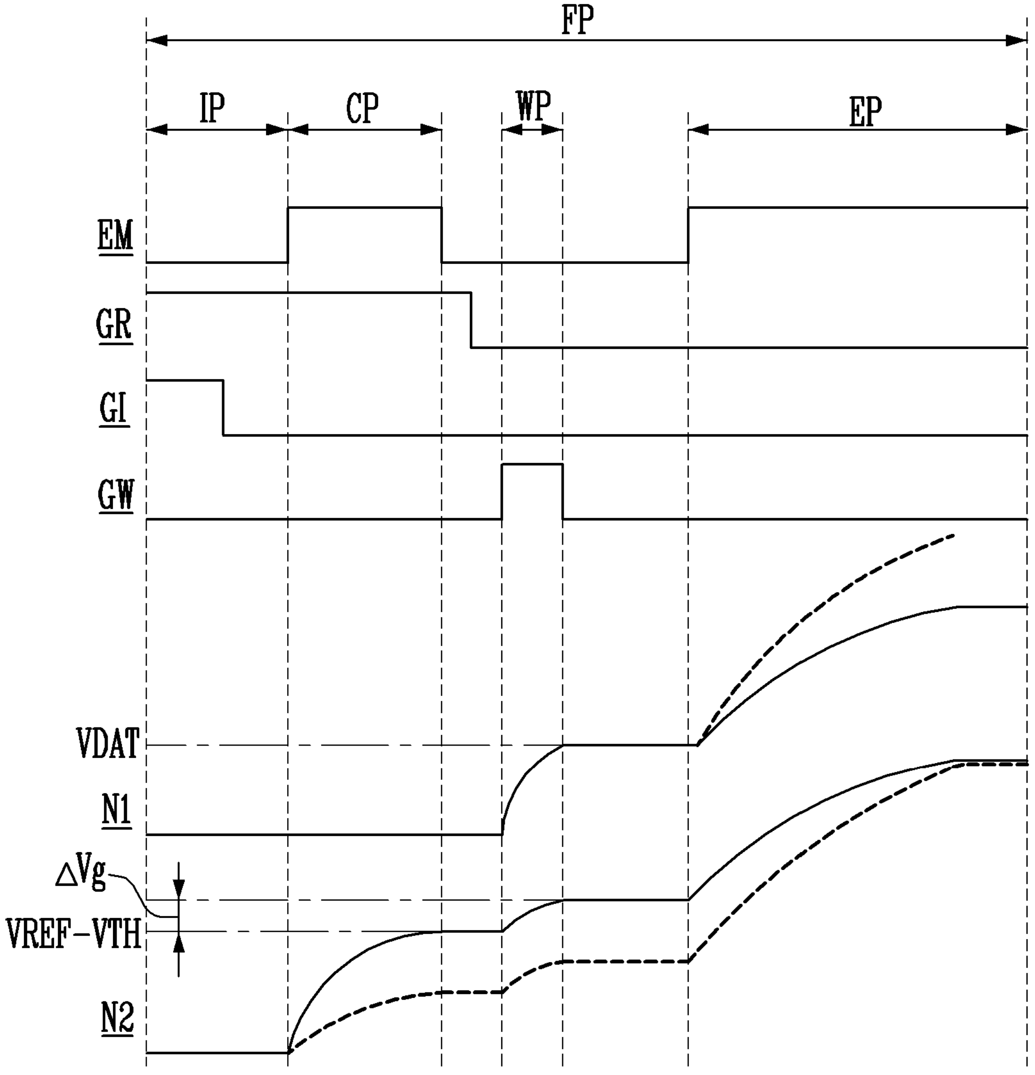
FIG. 4 is a timing diagram illustrating an operation in which a sub-pixel according to an embodiment is driven.

FIG. 4 is a timing diagram illustrating an operation in which a sub-pixel according to an embodiment is driven. In FIG. 4, each signal and a voltage at the nodes N1 and N2 according to an embodiment are shown as solid lines, and the voltage at the nodes N1 and N2 in case that the parasitic capacitance Cpa is experimentally generated is shown as a dotted line.

According to an embodiment, a frame period FP for the sub-pixel SPX may include an initialization period IP, a compensation period CP, a data writing period WP, and an emission period EP.

According to an embodiment, in the initialization period IP, the first node N1 and the second node N2 may be initialized. In the initialization period IP, the emission signal EM and scan signal GW may have a low level, and the initialization signal GI and the reset signal GR may have a high level. The third transistor T3 may be turned on in response to the reset signal GR having the high level to provide (for example, apply) the reference voltage VREF to the first node N1. The transistor T4 may be turned on in response to the initialization signal GI having the high level to provide (for example, apply) the initialization voltage VINT to the second node N2. Accordingly, the first node N1 may be initialized based on the reference voltage VREF, and the second node N2 may be initialized based on the initialization voltage VINT.

According to an embodiment, in the compensation period CP, a threshold voltage of the first transistor T1 may be compensated. In the compensation period CP, the initialization signal GI and the scan signal GW may have a low level, and the emission signal EM and the reset signal GR may have a high level. The third transistor T3 may be turned on in response to the reset signal GR having the high level to provide (for example, apply) the reference voltage VREF to the first node N1. The transistor T5 may be turned on in response to the emission signal EM having the high level. In case that the third transistor T3 is turned on, the reference voltage VREF may be provided (for example, applied) to the first node N1 (for example, the gate electrode of the first transistor T1). In case that the fifth transistor T5 is turned on, the first transistor T1 may be turned on with an on condition.

The first transistor T1 may be turned on until the voltage at the second node N2 becomes a voltage obtained by subtracting the threshold voltage VTH of the first transistor T1 from the reference voltage VREF. Accordingly, in the compensation period CP, the voltage of the second node N2 may be changed from the initialization voltage VINT to a reference voltage minus the threshold voltage (VREF-VTH). For example, the voltage of the second node N2 may be saturated with the voltage obtained by subtracting the threshold voltage VTH of the first transistor T1 from the reference voltage VREF, and the threshold voltage VTH of the first transistor T1 may be stored between both ends of the storage capacitor Cst. An operation of storing the threshold voltage VTH of the first transistor T1 in the storage capacitor Cst may be a compensation operation for compensating for the threshold voltage VTH of the first transistor T1.

In case that the parasitic capacitance Cpa is formed adjacent to the first transistor T1, the second node N2 may have a voltage different from an intended voltage range. For example, in case that the parasitic capacitance Cpa is formed, the second node N2 may have a reduced voltage. For example, in the compensation period CP, the second node N2 may have a voltage of "VREF−VTH", but in case that the parasitic capacitance Cpa is formed, the second node N2 may have a voltage of "VREF−VTH*((a size of a capacitance stored in the storage capacitor Cst/the parasitic capacitance Cpa))". Accordingly, a risk that a size of a compensation operation for compensating for the threshold voltage VTH may be distorted and reduced may occur.

According to an embodiment, in the data writing period WP, the data voltage VDAT of the data line DL may be written to the sub-pixel SPX. According to an embodiment, in the data writing period WP, the emission signal EM, the initialization signal GI, and the reset signal GR may have a low level, and the scan signal GW may have a high level. The second transistor T2 may be turned on in response to the scan signal GW having the high level to provide (for example, apply) the data voltage VDAT of the data line DL to the first node N1. Accordingly, the storage capacitor Cst may store the data voltage VDAT at the first node N1 (for example, a first electrode of the storage capacitor Cst). In case that a voltage of the first node N1 (for example, a voltage of the first electrode of the storage capacitor Cst) is changed from the reference voltage VREF to the data voltage VDAT (for example, in case that changed by "VDAT−VREF"), a voltage of a second electrode of the storage capacitor Cst (for example, the voltage of the second node N2) may be changed by a voltage change amount determined by a voltage change of the first node N1 and the capacitors Cst and Chold of the sub-pixel SPX. For example, a voltage change amount ΔVg of the second node N2 may be determined as "(VDAT−VREF)*(CHOLD)/(Cst+Chold)". According to an embodiment, in case that the voltage of the first node N1 becomes the data voltage VDAT and the voltage of the second node N2 becomes "VREF−VTH+ΔVg", a gate-source voltage of the first transistor T1 may become "VDAT−VREF+VTH−ΔVg".

In case that the parasitic capacitance Cpa is formed, the second node N2 may be saturated with a voltage less than "VREF−VTH+ΔVg".

According to an embodiment, in the emission period EP, the light emitting element LD may emit light. According to an embodiment, in the emission period EP, the initialization signal GI, the reset signal GR, and the scan signal GW may have a low level, and the emission signal EM may have a high level. The first transistor T1 may generate the driving current based on the voltage (VDAT−VREF+VTH−ΔVg) stored in the storage capacitor Cst, and the fifth transistor T5 may be turned on in response to the emission signal EM having the high level to form the path of the driving current from the line of the first power voltage ELVDD to the line of the second power voltage ELVSS.

In case that the parasitic capacitance Cpa is formed adjacent to the first transistor T1, the second node N2 may have a voltage according to a voltage path different from an intended voltage path. For example, as described above, the second node N2 may be saturated with a relatively low voltage in case that the parasitic capacitance Cpa is formed before the emission period EP, and thus a path in which a voltage of the second node N2 is changed over time may be distorted due to the parasitic capacitance Cpa. Since the parasitic capacitance Cpa may be defined as being connected to the first electrode of the storage capacitor Cst in series, a total capacitance size defined adjacent to the first node N1 may be reduced, and thus the voltage of the first node N1 may be increased due to the parasitic capacitance Cpa in the emission period EP.

Finally, as the parasitic capacitance Cpa is formed, an intensity of the driving current provided by the first transistor T1, which is the driving transistor, may be distorted, which may damage visibility of the display device DD, and minimizing formation of the parasitic capacitance Cpa may be preferable.

A transistor of the display device DD according to an embodiment is described with reference to FIGS. 5 and 6. For convenience of description, a content that may overlap the above-described content is briefly described or is not repeated.

Figure 5:
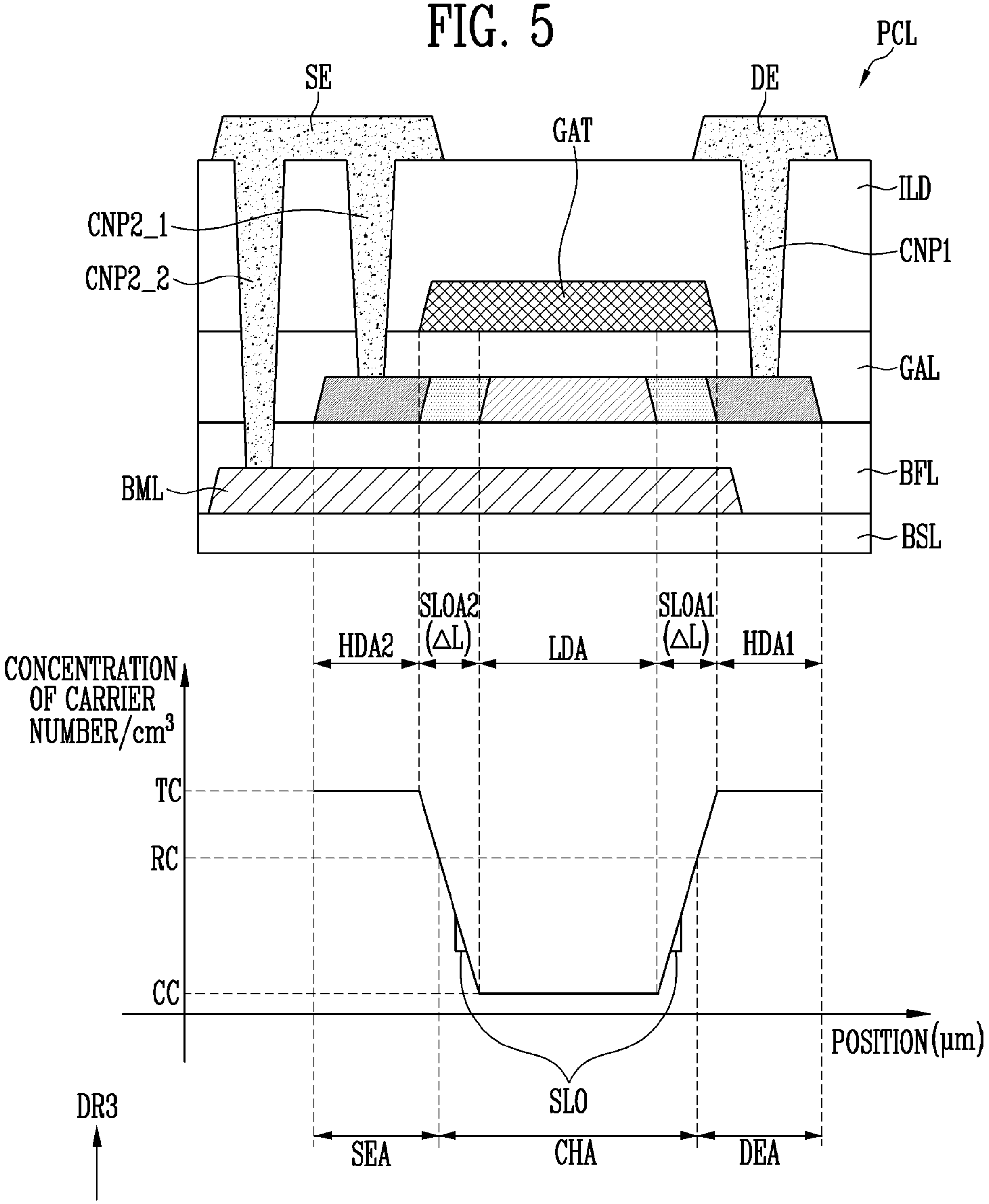
FIGS. 5 and 6 are schematic cross-sectional views illustrating a display device according to an embodiment.
Figure 6:
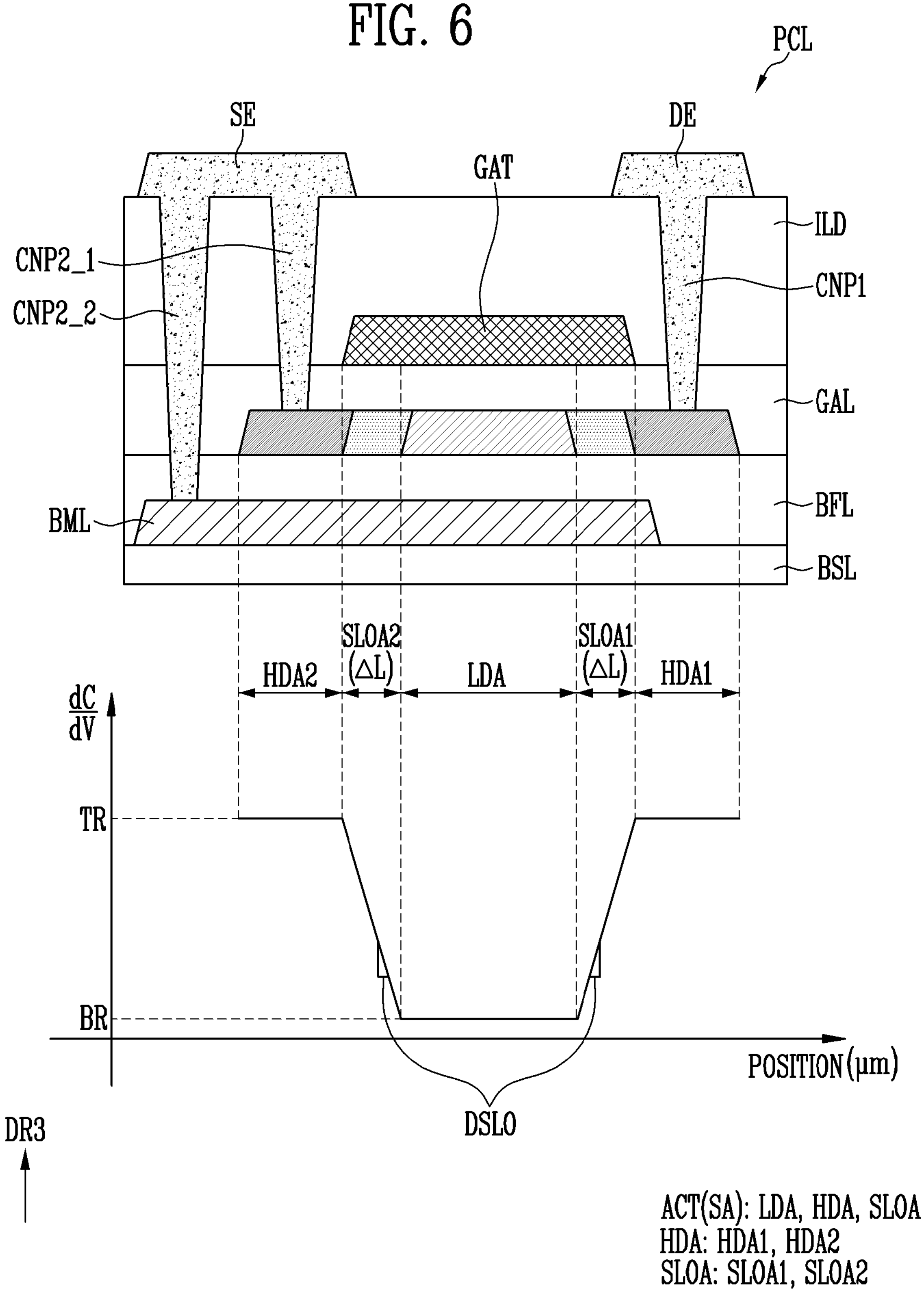

FIGS. 5 and 6 are schematic cross-sectional views illustrating a display device according to an embodiment. FIGS. 5 and 6 schematically illustrate at least a portion of a pixel-circuit layer PCL in which a transistor according to an embodiment is formed.

FIGS. 5 and 6 show the same cross-sectional structure. FIG. 5 further shows a graph related to a concentration of a carrier in each of areas of the semiconductor layer ACT, and FIG. 6 further shows a graph related to dC/dV measured using a scanning capacitance microscope in each of areas of the semiconductor layer ACT.

The transistor shown in FIGS. 5 and 6 may be the switching transistor (for example, the second transistor T2). However, the disclosure is not necessarily limited thereto, and the transistor shown in FIGS. 5 and 6 may be at least one of other transistors (for example, the first transistor T1 and the third to fifth transistors T3 to T5) other than the switching transistor.

Referring to FIGS. 5 and 6, the pixel-circuit layer PCL may include a lower conductive layer BML disposed on the base layer BSL, a transistor, and insulating layers. The transistor may include the semiconductor layer ACT, a gate electrode GAT, a source electrode SE, and a drain electrode DE.

The lower conductive layer BML may be disposed on the base layer BSL. The lower conductive layer BML may function as a path for forming the pixel circuit PXC or lines electrically connected thereto.

The buffer layer BFL may prevent diffusion of an impurity or moisture permeation into the semiconductor layer ACT of the transistor. According to an embodiment, the buffer layer BFL may include one or more of a group of silicon nitride ($SiN_x$), silicon oxide ($SiO_x$), silicon oxynitride ($SiO_xN_y$), and aluminum oxide ($Al_xO_y$). However, the disclosure is not necessarily limited to the above examples.

The semiconductor layer ACT may be disposed on the buffer layer BFL. According to an embodiment, the semiconductor layer ACT may include an oxide semiconductor. For example, the semiconductor layer ACT may be an oxide thin film transistor. The semiconductor layer ACT may include In-Ga-Zn-Oxygen (IGZO). However, the disclosure is not limited thereto. For example, the semiconductor layer ACT may include Hf—In—Zn—O (HIZO), In—Sn—Zn—O (ITZO), and Zn—O—N (ZnON).

The semiconductor layer ACT may include areas that may be divided based on a concentration of a carrier. As described above, since the disclosure is described based on an embodiment in which the transistor is an NMOS transistor, the carrier may be an electron. However, according to an embodiment, in case that the transistor is a PMOS transistor, the carrier may be a hole.

Figure 11:
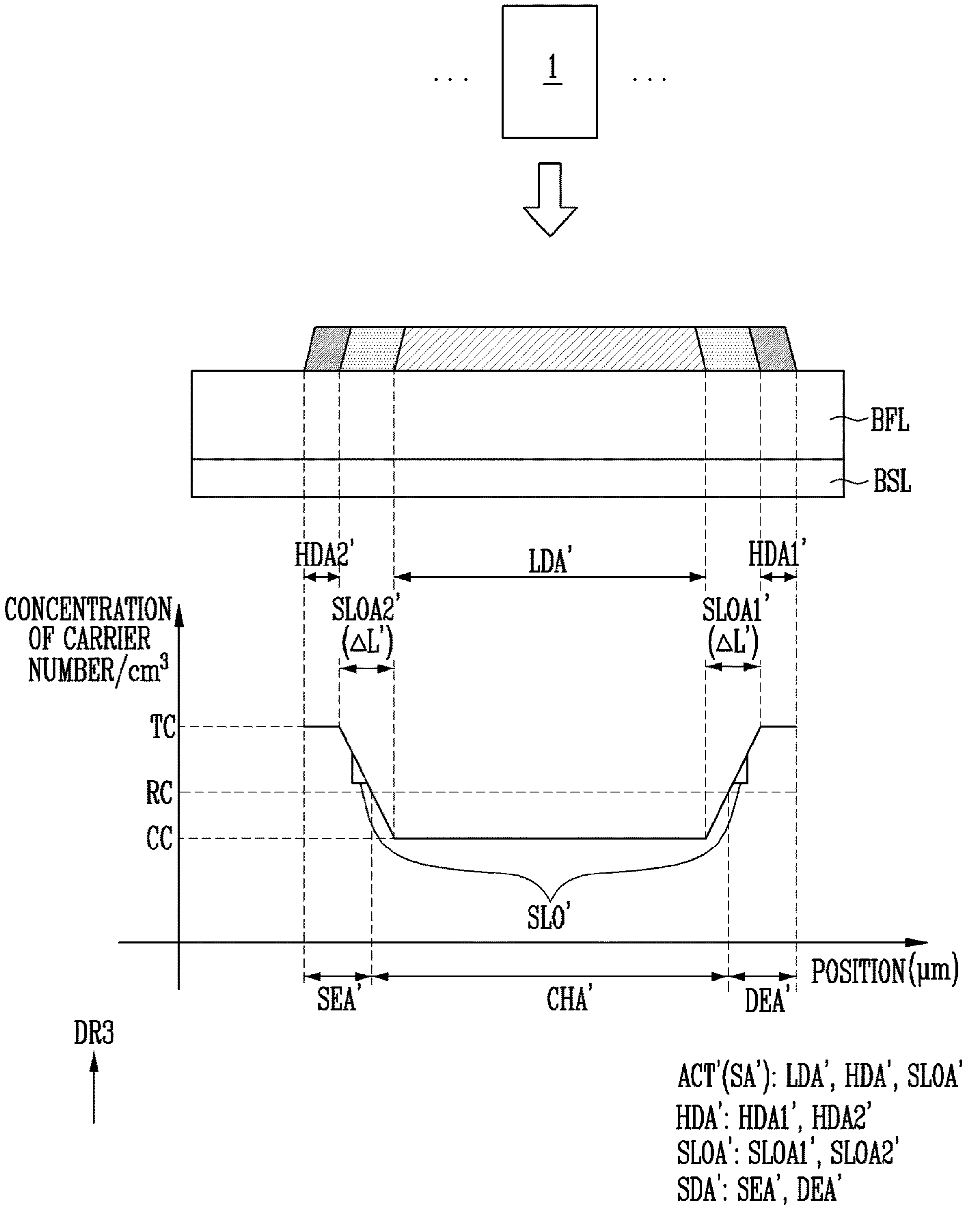
Figure 12:
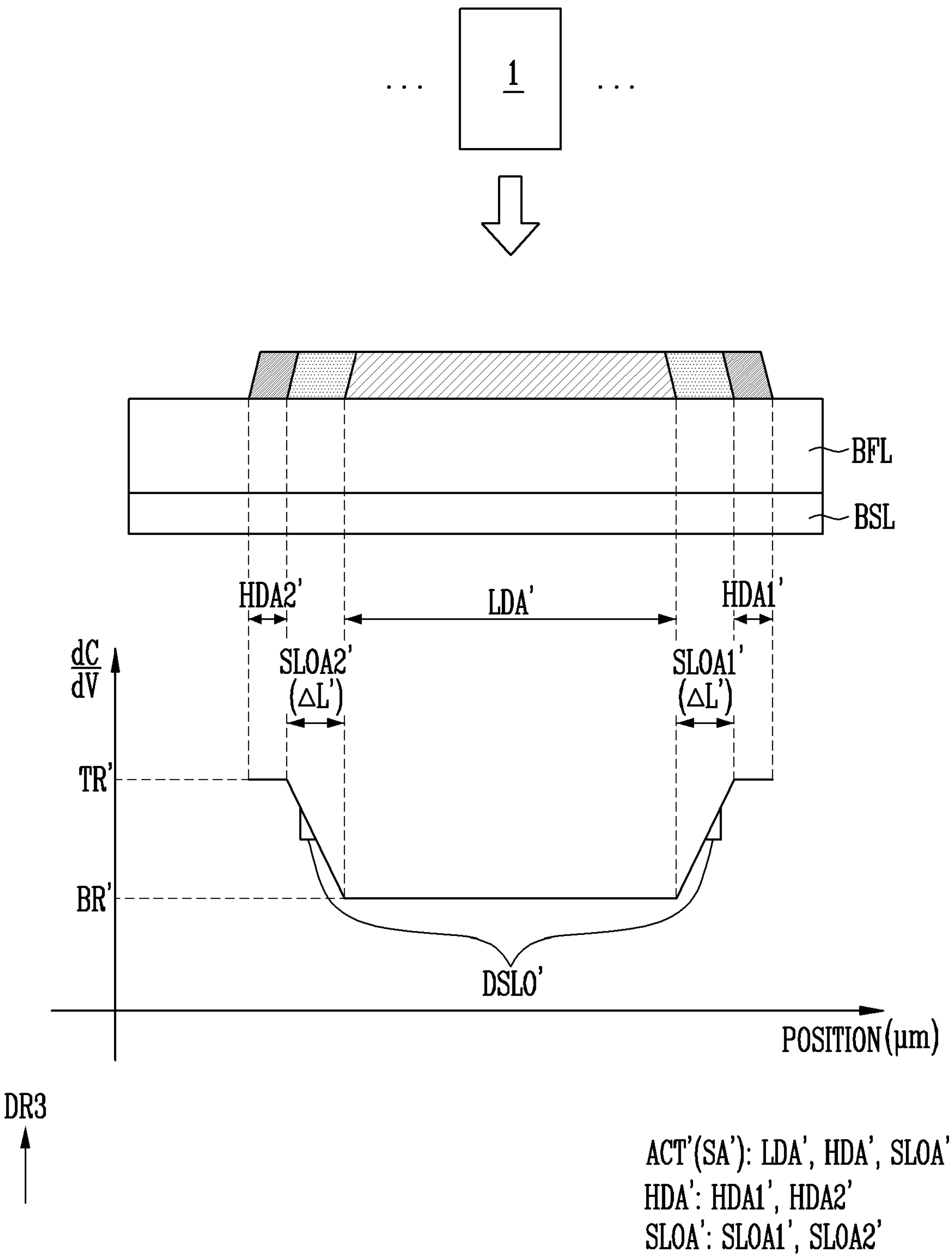

For example, the semiconductor layer ACT may include a low concentration area LDA, a high concentration area HDA, and a slope concentration area SLOA between the low concentration area LDA and the high concentration area HDA, which are divided based on the concentration of the carrier or dC/dV measured by the scanning capacitance microscopy (SCM) 1 (refer to FIG. 11). The high concentration area HDA may include a first high concentration area HDA1 and a second high concentration area HDA2, The low concentration area LDA, the high concentration area HDA, and the slope concentration area SLOA may be spaced apart from each other in a length direction of the semiconductor layer ACT (for example, a plane direction or a length direction of the base layer BSL).

In the specification, the plane direction may mean a direction of a plane on which the base layer BSL is disposed (for example, a direction in which a portion extends in the first direction DR1 and another portion extends in the second direction DR2).

The SCM 1 is an analysis technique capable of measuring charge distribution of a very small scale including micro-scale to nano-scale and the like within the spirit and the scope of the disclosure. The SCM 1 may measure a value of dC/dV (for example, a capacitance change rate according to a change rate of a voltage) at channel/source/drain areas as an active area including a semiconductor material to be analyzed. According to an embodiment, dC/dV may indicate a differential value of a change in a capacitance with respect to a change in a voltage at one position in the semiconductor layer ACT.

According to an embodiment, a graph showing the carrier concentration or dC/dV in each of the areas LDA, HDA, and SLOA shown in FIGS. 5 and 6 may be shown based on carrier concentration data or dC/dV measured in each of the areas LDA, HDA, and SLOA. For example, the graph showing the carrier concentration or dC/dV may be shown by performing data fitting on data measured in each of the areas LDA, HDA, and SLOA. For example, the carrier concentrations or dC/dV measured in the semiconductor layer ACT is indicated for each position in each of the high concentration area HDA, the low concentration area LDA, and the slope concentration area SLOA, the indicated carrier concentrations are fit to correspond to y=ax+b graph, a graph line indicating a tendency thereof may be obtained, and the obtained graph line is shown.

In the low concentration area LDA, the semiconductor layer ACT may have a carrier concentration in a low concentration range. The low concentration range may include a carrier concentration numerical value of a low concentration CC. In the low concentration area LDA, dC/dV measured in the semiconductor layer ACT may have a differential value range including a relatively low numerical value BR.

In the high concentration area HDA, the semiconductor layer ACT may have a carrier concentration of a high concentration range. The high concentration range may include a carrier concentration numerical value of a high concentration TC. In the high concentration area HDA, dC/dV measured in the semiconductor layer ACT may have a differential value range including a relatively high numerical value TR.

The high concentration TC may indicate a carrier concentration numerical value greater than that of the low concentration CC. For example, the low concentration CC may be about $10^{14}$ (numerical/$CM^3$). The high concentration TC may be about $10^{18}$ (numerical/$CM^3$). However, the disclosure is not limited thereto. The high concentration TC may be sufficient in case that the high concentration TC is defined as a carrier concentration sufficiently greater than the low concentration CC.

The slope concentration area SLOA may be defined between the high concentration area HDA and the low concentration area LDA. For example, a graph indicating the carrier concentration according to a position of the semiconductor layer ACT may have an inflection point between a graph of the carrier concentration in the slope concentration area SLOA and a graph of the carrier concentration in the high concentration area HDA. The graph indicating the carrier concentration may have an inflection point between the graph of the carrier concentration in the slope concentration area SLOA and a graph of the carrier concentration in the low concentration area LDA.

The slope concentration area SLOA may be defined between an area of a high numerical value TR (TR') and an area of a low numerical value BR (BR'). For example, a graph indicating dC/dV according to the position of the semiconductor layer ACT may have an inflection point between a graph of dC/dV in the slope concentration area SLOA and a graph of dC/dV in the high concentration area HDA. A graph indicating dC/dV may have an inflection point between the graph of dC/dV in the slope concentration area SLOA and a graph of dC/dV in the low concentration area LDA.

According to an embodiment, at least a portion of the semiconductor layer ACT may overlap the gate electrode GAT in a plan view. At least another portion of the semiconductor layer ACT may not overlap the gate electrode GAT in a plan view.

For example, the low concentration area LDA may entirely overlap the gate electrode GAT in a plan view. According to an embodiment, the slope concentration area SLOA may overlap the gate electrode GAT in a plan view. According to an embodiment, the slope concentration area SLOA may entirely overlap the gate electrode GAT in a plan view. For example, the slope concentration area SLOA may include a first slope concentration area SLOA1 adjacent to the source area SEA and a second slope concentration area SLOA2 adjacent to the drain area DEA. The first slope concentration area SLOA1 may overlap a first end of the gate electrode GAT. The second slope concentration area SLOA2 may overlap a second end of the gate electrode GAT.

According to an embodiment, in the slope concentration area SLOA, the carrier concentration may be changed according to one slope SLO. For example, in the slope concentration area SLOA, the carrier concentration may be changed by one concentration range determined based on a slope SLO according to a position change amount of the semiconductor layer ACT.

According to an embodiment, the slope SLO may be referred to as $\Delta Y/\Delta X$.

According to an embodiment, in the slope concentration area SLOA, the semiconductor layer ACT may satisfy Equation 1 below.

$$6.6 \leq \frac{\Delta Y}{\Delta X} \leq 11\ [1/(\text{cm}^3 \cdot \mu\text{m})] \quad \text{[Equation 1]}$$

In Equation 1, $\Delta X$ may be a length change amount [μm] along the length direction of the semiconductor layer ACT in the slope concentration area SLOA, and $\Delta Y$ may be a change amount of the carrier concentration [$1/(\text{cm}^3)$] in the length change amount in the slope concentration area SLOA.

According to an embodiment, in the slope concentration area SLOA, a value of dC/dV measured by the SCM 1 may be changed according to one capacity slope DSLO. For example, in the slope concentration area SLOA, dC/dV, may be a capacitance change amount according to a voltage and may be changed by one range based on the capacity slope DSLO according to the position change amount of the semiconductor layer ACT.

According to an embodiment, in the slope concentration area SLOA, the semiconductor layer ACT may satisfy Equation 2 below.

$$8600 \leq \frac{dC}{dV} \leq 10000 \quad \text{[Equation 2]}$$

In Equation 2, dC/dV may be related to data measured by the SCM 1, and may be a differential value defined based on the capacitance change amount according to the voltage change amount measured in the slope concentration area SLOA of the semiconductor layer ACT.

According to an embodiment, the semiconductor layer ACT (for example, a semiconductor area SA of the semiconductor layer ACT) may include a channel area CHA and a source or drain area SDA. The source or drain area SDA may include a source area SEA formed on one side or a side of the channel area CHA and electrically connected to the source electrode SE, and a drain area DEA formed on another side of the channel area CHA and electrically connected to the drain electrode DE.

The channel area CHA may include the low concentration area LDA and a portion of the slope concentration area SLOA. For example, the channel area CHA may include an area having a carrier concentration less than a reference concentration RC as a portion of the slope concentration area SLOA.

According to an embodiment, the reference concentration may be appropriately determined according to an operation characteristic of a transistor to be manufactured. The reference concentration may be included in a carrier concentration range defined in the slope concentration area SLOA. The reference concentration may be greater than the low concentration CC and may be less than the high concentration TC.

According to an embodiment, the slope concentration area SLOA may include an area overlapping the gate electrode GAT in a plan view among areas (for example, the source area SEA and the drain area DEA) other than the channel area CHA. The slope concentration area SLOA may include an area of the channel area CHA, which overlaps the gate electrode GAT in a plan view.

The source or drain area SDA may include the high concentration area HDA and a portion the slope concentration area SLOA. For example, the source or drain area SDA may include an area having a carrier concentration greater than the reference concentration RC as a portion of the slope concentration area SLOA.

According to an embodiment, a dopant may be provided (for example, doped) to the source or drain area SDA. For example, the dopant may be provided to the source or drain area SDA to control conductivity in the source or drain area SDA.

Experimentally, in case that the source or drain area SDA overlaps the gate electrode GAT, a risk that the parasitic capacitance Cpa is formed between the source or drain area SDA and the gate electrode GAT may exist. According to an embodiment, as an area other than the channel area CHA, an area overlapping the gate electrode GAT may be minimized, and formation of the parasitic capacitance Cpa may be minimized.

For example, in order to minimize the area overlapping the gate electrode GAT as the area other than the channel area CHA, a length AL of the slope concentration area SLOA may be required to be reduced, and the slope SLO related to the concentration of the carrier may be required to be increased in the slope concentration area SLOA.

According to an embodiment, the semiconductor layer ACT may be manufactured to minimize the slope concentration area SLOA, and the slope SLO of the carrier concentration and the capacity slope DSLO of dC/dV formed in the slope concentration area SLOA may be defined as relatively steep. For example, the slope SLO of the carrier concentration formed in the slope concentration area SLOA may satisfy Equation 1 described above, and the capacity slope DSLO of dC/dV may satisfy Equation 2 described above. According to an embodiment, the length $\Delta L$ of the slope concentration area SLOA may be in a range of about 0.05 μm to about 0.5 μm. According to an embodiment, the length AL of the slope concentration area SLOA may be in a range of about 0.1 μm to about 0.4 μm. However, the disclosure is not necessarily limited thereto.

A risk that areas other than the channel area CHA overlap the gate electrode GAT may be minimized, and the formation of the parasitic capacitance Cpa may be prevented. Accordingly, the risk that an abnormal image such as a stain due to the formation of the parasitic capacitance Cpa is visually recognized may be prevented, and as a result, the display device DD with excellent display quality may be implemented.

The semiconductor layer ACT according to an embodiment may include an oxide semiconductor, and in order for the slope SLO and the capacity slope DSLO to be defined steeply (for example, in order to satisfy Equation 1 and Equation 2), a range of the low concentration area LDA is required to be defined relatively narrowly, and the low concentration CC may be required to be defined low. Process factors for manufacturing the semiconductor layer ACT are required to be closely controlled.

Experimentally, the oxide semiconductor may further include an oxide film in a material (for example, silicon) for forming a semiconductor. The oxide semiconductor may have relatively great insulating characteristic and resistance characteristic, and may have a generally non-uniform surface characteristic. Accordingly, an aspect in which analyzing an element characteristic such as a carrier for an active layer including an oxide semiconductor may be somewhat difficult. Therefore, closely controlling the process factors during a semiconductor manufacturing process may be difficult.

However, according to an embodiment, in order to analyze the semiconductor layer ACT (for example, the semiconductor layer ACT including the oxide semiconductor), the SCM 1 may be used, and process factors for properly performing the SCM 1 may be controlled. Therefore, an element characteristic such as a carrier may be closely controlled, and thus a robust semiconductor layer ACT may be manufactured.

For example, according to an embodiment, a process of analyzing the semiconductor layer ACT using the SCM 1 may be performed under a suitable process environment, a process environment for defining the element characteristic of the semiconductor layer ACT may be updated at least once, and a semiconductor layer ACT having a characteristic intended by a process user (for example, satisfying Equation 1 and Equation 2) may be manufactured. A manufacturing process is described later.

According to an embodiment, a gate insulating layer GAL may be disposed on the semiconductor layer ACT. At least a portion of the gate insulating layer GAL may be disposed between the gate electrode GAT and the semiconductor layer ACT. The gate insulating layer GAL may include an inorganic material, and an example thereof is not particularly limited.

According to an embodiment, the gate electrode GAT may be disposed on the gate insulating layer GAL. The gate electrode GAT may overlap the channel area CHA and overlap the slope concentration area SLOA in a plan view. The gate electrode GAT may include a conductive material, and an example thereof is not particularly limited.

According to an embodiment, an interlayer insulating layer ILD may be disposed on the gate electrode GAT. The interlayer insulating layer ILD may cover the gate electrode GAT and may include holes in which contact members CNP1, CNP2_1, and CNP2_2 are formed. The interlayer insulating layer ILD may include an inorganic material or an organic material, and an example thereof is not particularly limited.

According to an embodiment, the source electrode SE and the drain electrode DE may be disposed on the interlayer insulating layer ILD. The source electrode SE may be electrically connected to the source area SEA of the semiconductor layer ACT through the (2_1)-th contact member CNP2_1 passing through the interlayer insulating layer ILD. According to an embodiment, the source electrode SE may be electrically connected to the lower conductive layer BML through the (2_2)-th contact member CNP2_2 passing through the interlayer insulating layer ILD. The drain electrode DE may be electrically connected to the drain area DEA of the semiconductor layer ACT through the first contact member CNP1 passing through the interlayer insulating layer ILD. The source electrode SE and the drain electrode DE may include a conductive material, and an example thereof is not particularly limited.

A method of manufacturing a display device DD according to an embodiment is described with reference to FIGS. 7 to 15. For convenience of description, a content that may overlap the above-described content is briefly described or is not repeated.

Figure 7:
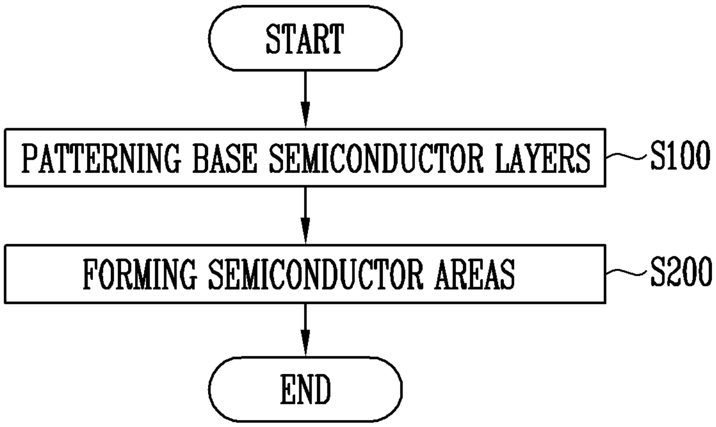
FIGS. 7 and 8 are schematic flowcharts illustrating a method of manufacturing a display device according to an embodiment.
Figure 8:
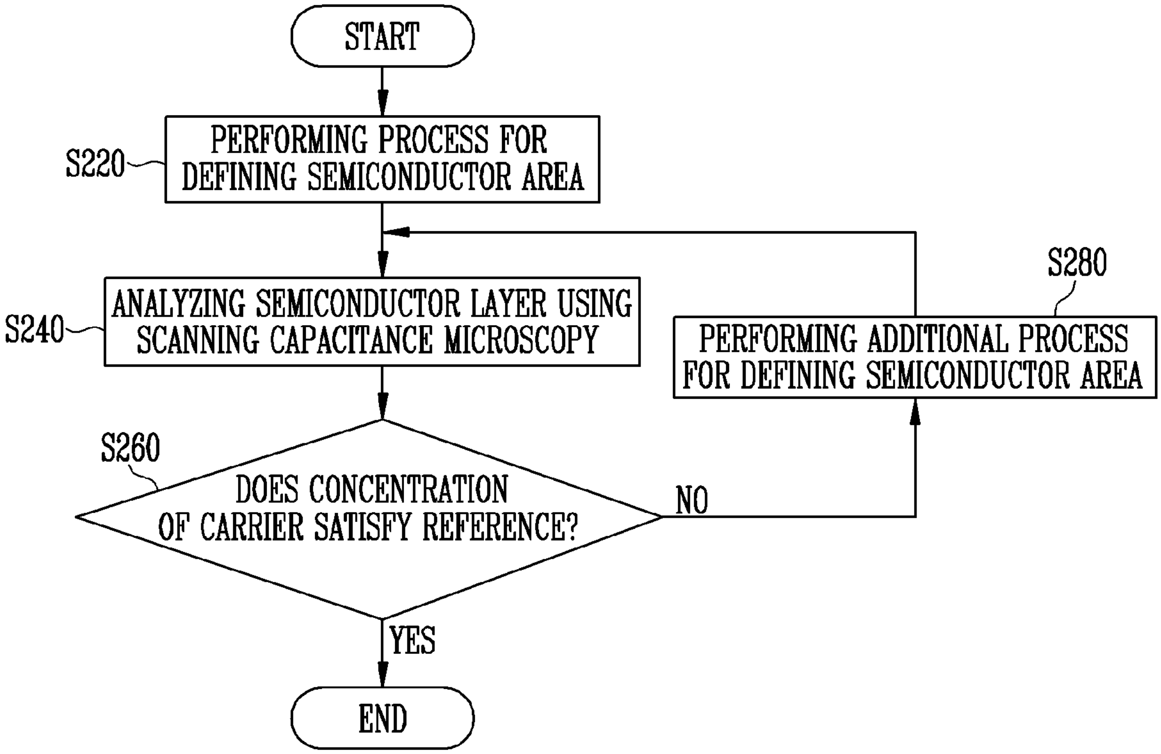

FIGS. 7 and 8 are schematic flowcharts illustrating a method of manufacturing a display device according to an embodiment. FIGS. 9 to 15 are schematic cross-sectional views for each process step illustrating a method of manufacturing a display device according to an embodiment. FIGS. 9 to 15 show a cross-sectional structure of the embodiment described above with reference to FIGS. 5 and 6.

Referring to FIG. 7, the method of manufacturing the display device DD according to an embodiment may include patterning a base semiconductor layer (S100) and forming semiconductor areas (S200).

Referring to FIG. 8, according to an embodiment, forming the semiconductor areas (S200) may include performing a process for defining the semiconductor areas (S220), analyzing the semiconductor layer using a SCM (S240), determining whether a concentration of a carrier satisfies a reference (S260), and performing an additional process for defining the semiconductor area based on a determination result (S280).

Figure 9:
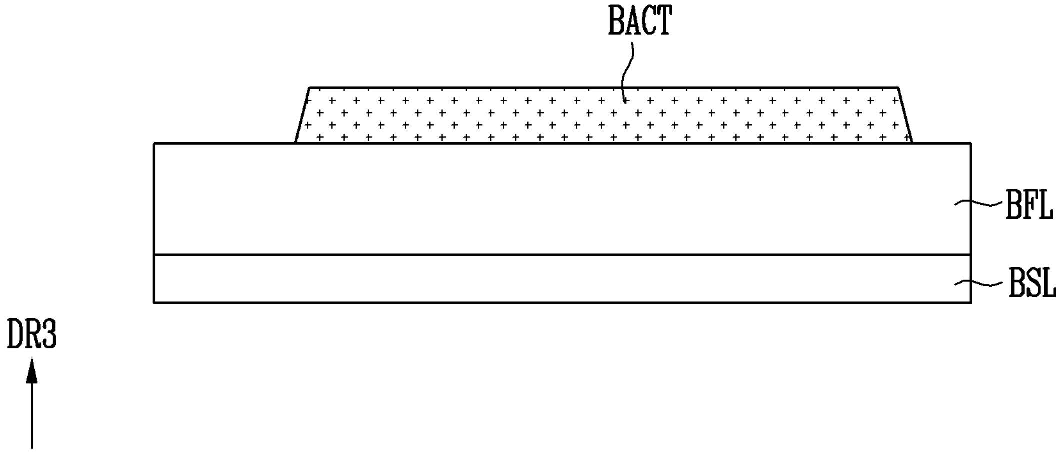
FIGS. 9 to 15 are schematic cross-sectional views for each process step illustrating a method of manufacturing a display device according to an embodiment.

Referring to FIGS. 7 and 9, in patterning the base semiconductor layer (S100), a base semiconductor layer BACT may be disposed (for example, patterned) on a base layer BSL (for example, a substrate or the like).

For example, a buffer layer BFL may be disposed (or deposited) on the base layer BSL, and the base semiconductor layer BACT may be disposed to contact the buffer layer BFL. According to an embodiment, the lower conductive layer BML may be patterned before the buffer layer BFL is formed.

According to an embodiment, a conductive layer or an insulating layer on the base layer BSL may be formed based on a selectable process for manufacturing a semiconductor device. For example, the conductive layer or the insulating layer on the base layer BSL may be formed by a photolithography process and may be deposited by various methods (sputtering, chemical vapor deposition, and the like). The disclosure is not necessarily limited to a particular example.

According to an embodiment, the base semiconductor layer BACT may be for manufacturing the semiconductor layer ACT and may include an oxide semiconductor material.

Figure 10:
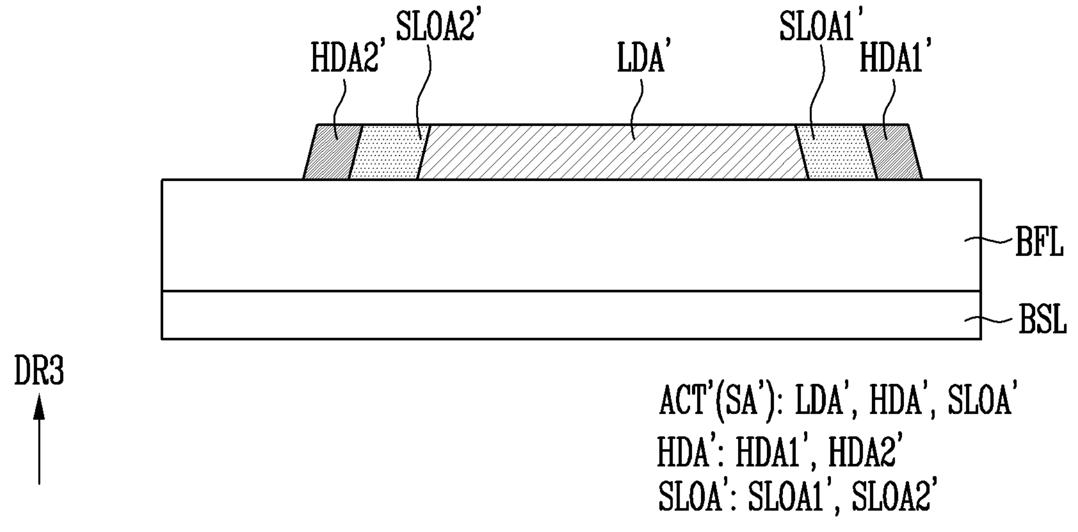

Referring to FIGS. 7, 8, and 10, as a partial step of forming the semiconductor areas (S200), a process for defining the semiconductor area (S220) may be performed.

In the specification, the "semiconductor area" may mean the "channel area" and the "source or drain area". For example, the step may be a step of allowing the semiconductor layer ACT to have an element characteristic for functioning as a transistor including a threshold voltage.

The step may include doping the base semiconductor layer BACT with a dopant (for example, ions). The step may include a heat treatment process (for example, an annealing process).

According to an embodiment, the heat treatment process in the step may be performed at a process temperature in a range of about 300° C. to about 650° C. In case that the heat treatment process is performed in the above-described numerical range, even in a case where the base semiconductor layer BACT may include an oxide semiconductor, a sufficient threshold voltage may be secured, and a range of the semiconductor areas SA may be closely controlled in the base semiconductor layer BACT including the oxide semiconductor.

According to an embodiment, the dopant may be provided to the base semiconductor layer BACT and the heat treatment process may be performed to manufacture a pre-updated-semiconductor layer ACT'. According to an embodiment, the pre-updated-semiconductor layer ACT' may include a pre-updated-semiconductor area SA', and may include a pre-updated-low concentration area LDA', a pre-updated-slope concentration area SLOA', and a pre-updated-high concentration area HDA'.

The pre-updated-slope concentration area SLOA' may include a first pre-updated-slope concentration area SLOA1' and a second pre-updated-slope concentration area SLOA2'. The pre-updated-high concentration area HDA' may include a first pre-updated-high concentration area HDA1' and a second pre-updated-high concentration area HDA2'.

The step may be performed before performing an analysis of the carrier concentration for a target layer using the SCM. Accordingly, in step, clearly determining the carrier concentration for the pre-updated-semiconductor layer ACT' may be difficult, clearly distinguishing the pre-updated-low concentration area LDA', the pre-updated-slope concentration area SLOA', and the pre-updated-high concentration area HDA' from each other may be difficult.

Referring to FIGS. 7, 8, 11, and 12, as a partial step of forming the semiconductor areas (S200), analyzing the semiconductor layer using the SCM 1 may be performed. For convenience of description, in FIGS. 11 and 12, the pre-updated-semiconductor layer ACT' is shown based on data that does not satisfy one reference.

In the step, the SCM 1 may analyze an element characteristic of the pre-updated-semiconductor layer ACT'. Accordingly, information on the carrier concentration in the pre-updated-semiconductor layer ACT' may be obtained.

For example, the SCM 1 may measure dC/dV for each area of the pre-updated-semiconductor layer ACT'. The carrier concentration for each area of the pre-updated-semiconductor layer ACT' may be analyzed, based on the measured dC/dV. For example, a numerical value tendency of dC/dV for each area of the pre-updated-semiconductor layer ACT' may correspond to a tendency of the carrier concentration, and a carrier concentration gradient for each area may be analyzed, based on the information on dC/dV obtained by the SCM 1.

According to an embodiment, the SCM 1 may include a probe capable of electrically contacting an upper portion of the pre-updated-semiconductor layer ACT' to be analyzed. The probe may measure a capacitance between the probe and an analysis target while scanning the analysis target, and thus information on a charge distribution of the analysis target may be obtained.

The step may be performed, and thus in the pre-updated-semiconductor layer ACT', the pre-updated-low concentration area LDA', the pre-updated-slope concentration area SLOA', and the pre-updated-high concentration area HDA' may be distinguished from each other. Based on the reference concentration RC, pre-updated-source or drain area SDA' and a pre-updated-channel area CHA' may be distinguished. The pre-updated-source or drain area SDA' may also include pre-updated-source area SEA' and pre-updated-drain area DEA'.

Referring to FIGS. 7 and 8, as a partial step forming the semiconductor areas (S200), determining whether the concentration of the carrier satisfies a reference (S260) may be performed.

For example, in a previous process step, information on the carrier concentration in the pre-updated-semiconductor layer ACT' may be obtained. Accordingly, in the step, it may be determined whether the pre-updated-semiconductor layer ACT' satisfies the reference by comparing the obtained information on the carrier concentration with a selectable carrier concentration reference.

For example, the selectable carrier concentration reference may be a reference defined based on the carrier concentration obtained based on a measurement result of dC/dV. By way of example, the selectable carrier concentration reference may be a reference defined based on the measurement result of dC/dV for example, based on only a measurement result).

According to an embodiment, the selectable carrier concentration reference may include whether the length AL (for example, pre-updated-length ΔL') of the slope concentration area SLOA (for example, the pre-updated-slope concentration area SLOA') is less than or equal to a selectable reference length. For example, the selectable reference length may be about 0.5 μm or less. In case that the length ΔL is less than the selectable reference length, it may be determined that the reference is satisfied.

According to an embodiment, the selectable carrier concentration reference may include whether the slope SLO (for example, a pre-updated-slope SLO') defined in the slope concentration area SLOA (for example, the pre-updated-slope concentration area SLOA') is greater than or equal to a selectable reference slope. For example, the selectable reference slope may be 6.6 or less. In case that the slope SLO is greater than the selectable reference slope, it may be determined that the reference is satisfied.

According to an embodiment, the selectable carrier concentration reference may include whether the capacity slope DSLO (for example, pre-updated-slope DSLO') defined in the slope concentration area SLOA (for example, a pre-updated slope concentration area SLOA') is greater than or equal to a selectable reference capacity slope. For example, the selectable reference slope may be 8600 or less. In case that the capacity slope DSLO is greater than the selectable reference capacity slope, it may be determined that the reference is satisfied.

According to an embodiment, the selectable carrier concentration reference may include whether a numerical range of the high concentration TC and the low concentration CC is within a selectable reference numerical range. In case that the numerical range of the high concentration TC and the low concentration CC is within the selectable reference numerical range, it may be determined that the reference is satisfied.

According to an embodiment, the selectable carrier concentration reference may include whether a length of the intended source or drain area SDA (for example, the pre-updated-source or drain area (SDA')) and channel area CHA (for example, the update-pre-channel area CHA) is included in a selectable reference length range.

In the step, in case that the concentration of the carrier satisfies the reference, it may be determined that the pre-updated-semiconductor layer ACT' is manufactured to have a suitable element characteristic, and thus the pre-updated-semiconductor layer ACT' may be provided as the semiconductor layer ACT described above.

In the step, in case that the concentration of the carrier does not satisfy the reference, it may be determined that the pre-updated-semiconductor layer ACT' is manufactured so as not to have a suitable element characteristic, and thus a subsequent additional process for more closely defining the semiconductor area SA (for example, performing the additional process (S280) may be further performed.

Figure 13:
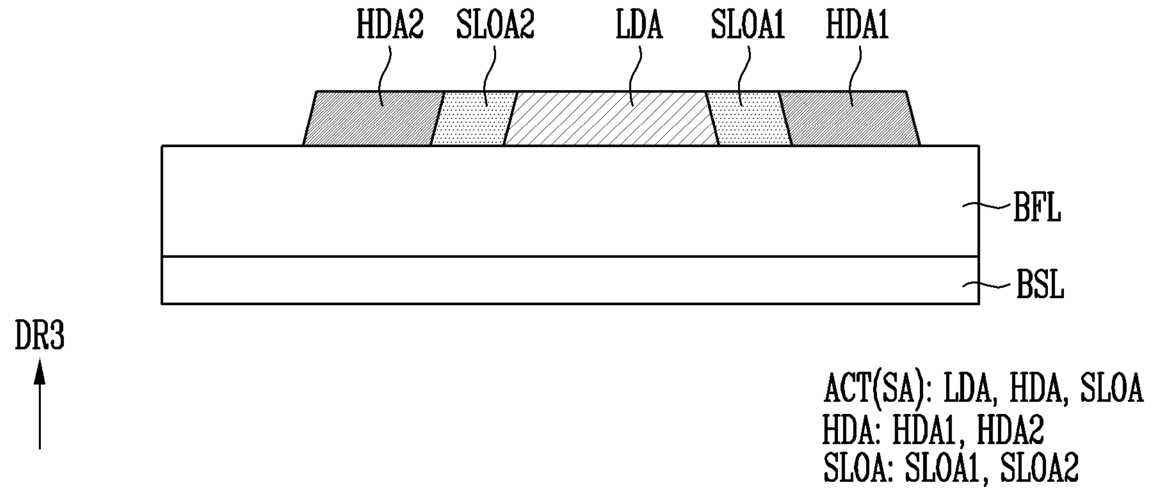
Figure 14:
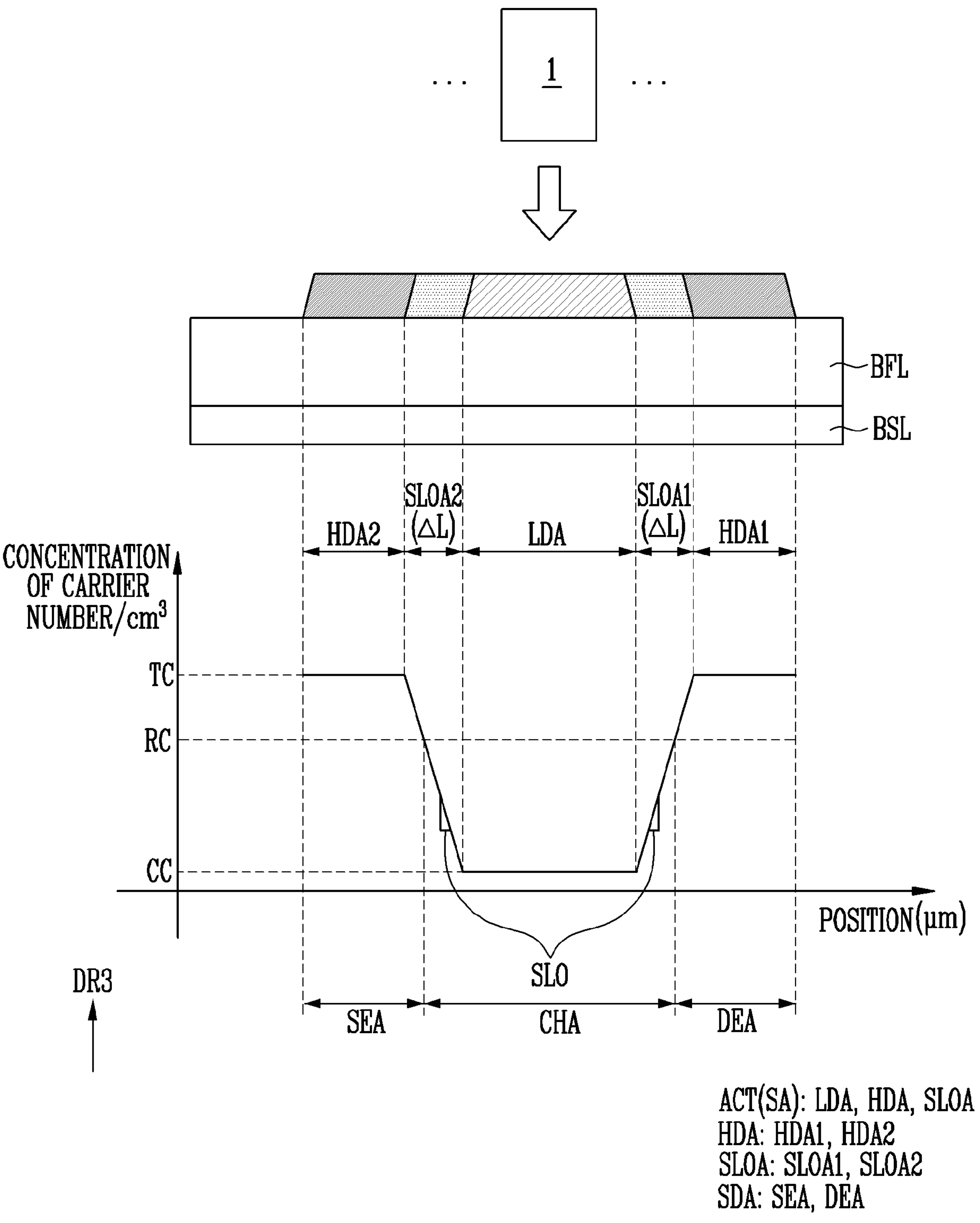
Figure 15:
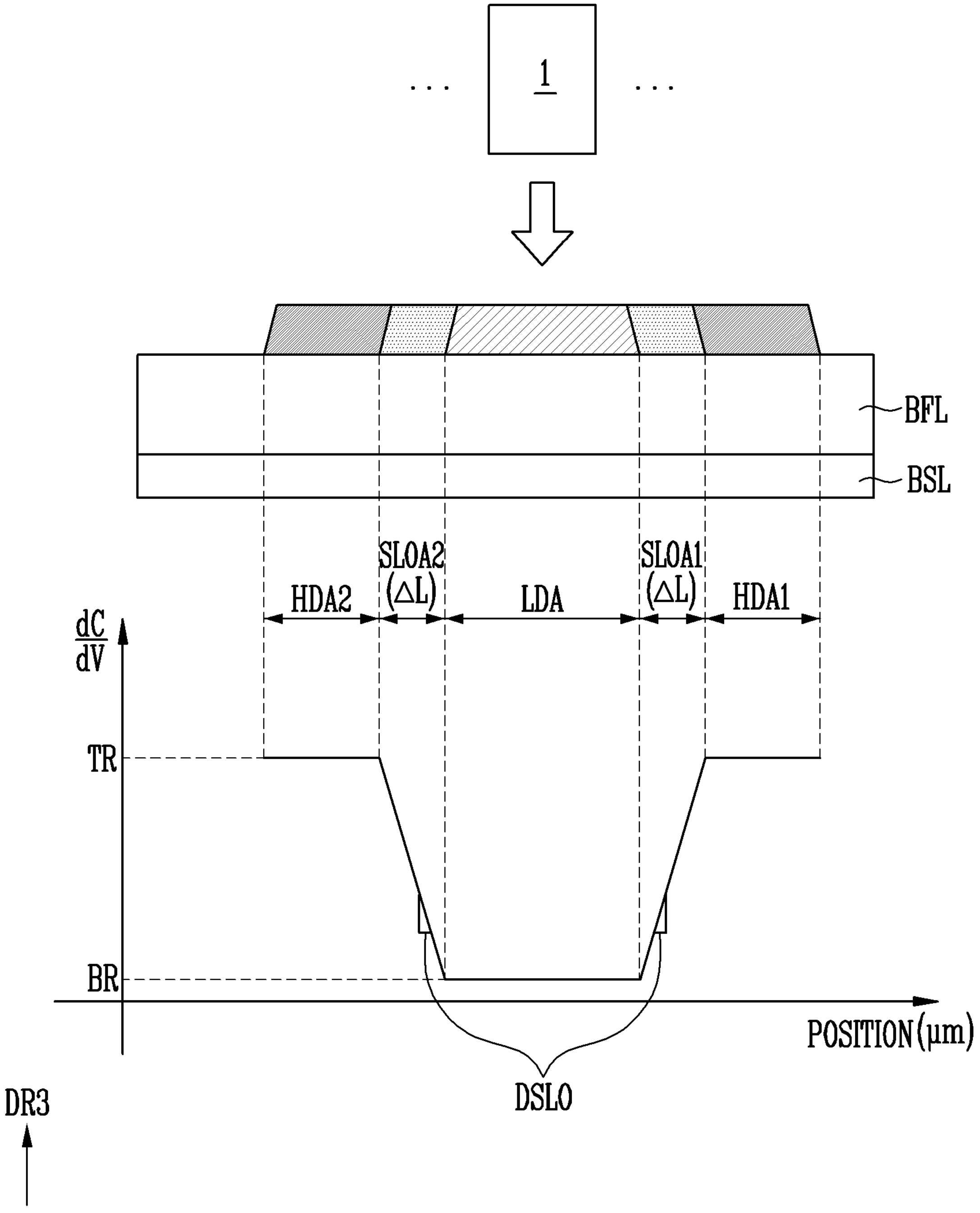

Referring to FIGS. 7, 8, and 13, as a partial step of forming the semiconductor areas (S200), performing the additional process for defining the semiconductor area (S280) may be performed.

The step may be performed in case that the concentration of the carrier does not satisfy the reference in the previous determining step (S260).

In the step, at least a portion of the process the same as the process performed in performing the process for defining the semiconductor area (S220) may be performed. For example, a process of providing a dopant to a partial area of the pre-updated-semiconductor layer ACT' and a heat treatment process may be performed. As described above, since information on the carrier concentration for each area of the pre-updated-semiconductor layer ACT' may be closely secured using the SCM, the process for defining the semiconductor areas SA may be performed with high efficiency. For example, the dopant may be selectively doped in some or a number of areas where the carrier concentration is required to be increased. Accordingly, the semiconductor areas SA may be manufactured such that the length ΔL of the slope concentration area SLOA may have a numerical value lower than one numerical range.

In the step, the performed heat treatment process may also be performed at a process temperature in a range of about 300° C. to about 650° C., and the above-described technical effect may be maintained as well.

By performing the step, in the pre-updated-semiconductor layer ACT', the carrier concentration for each area may be updated. Accordingly, the pre-updated-semiconductor layer ACT' may be provided as an update semiconductor layer. Accordingly, the low concentration area LDA, the high concentration area HDA, and the slope concentration area SLOA may be formed. At least a portion of a range of the low concentration area LDA, the high concentration area HDA, and the slope concentration area SLOA may be different from a range in which the pre-updated-low concentration area LDA', the pre-updated-slope concentration area SLOA', and the pre-updated-high concentration area HDA' is formed.

Referring to FIGS. 7, 8, 14, and 15, as a partial step of forming the semiconductor areas (S200), after performing the additional process for defining the semiconductor areas (S280), analyzing the semiconductor layer using the SCM (S240) and determining whether the concentration of the carrier satisfies the reference (S260) may be further performed.

Analyzing (S240) and determining (S260) performed after performing the additional process (S280) may be substantially the same as the process described above.

Accordingly, the additional process may be performed to determine whether the updated semiconductor layer has the suitable element characteristic, and in case that it is determined that the updated semiconductor layer has the suitable element characteristic, the updated semiconductor layer may not be processed again, and may be provided as the semiconductor layer ACT according to an embodiment. In the step, the additional process may be performed to determine whether the updated semiconductor layer has the suitable element characteristic, and in case that it is determined that the updated semiconductor layer does not have the suitable element characteristic, performing the additional process (S280), analyzing (S240), and determining (S260) may be further performed.

For convenience of description, the disclosure is described based on an embodiment in which the above-described process cycle is performed once, but the number of repetitions of the above-described process cycle is not particularly limited.

Consequently, according to an embodiment, the manufacturing process of the semiconductor layer ACT using the SCM 1 may be optimized, and thus the semiconductor layer ACT having the intended element characteristic may be provided. As the pixel circuit PXC has the intended element characteristic, a risk that the parasitic capacitance Cpa is formed in the transistor (for example, the switching transistor) including the semiconductor layer ACT may be prevented, and the display device DD with remarkably improved display performance/quality may be manufactured.

Thereafter, the insulating layer and conductive layers (for example, the gate electrode GAT, the source electrode SE, and the drain electrode DE) described above with reference to FIGS. 5 and 6 may be patterned, and thus the pixel-circuit layer PCL may be manufactured. The light-emitting-element layer LEL including the light emitting element LD on the pixel-circuit layer PCL may be manufactured, and thus the display device DD according to an embodiment may be manufactured.

As described above, although the disclosure has been described with reference to the embodiments above, those skilled in the art or those having a common knowledge in the art will understand that the disclosure may be variously modified and changed without departing from the spirit and technical area of the disclosure and as described in the claims.

Therefore, the technical scope of the disclosure should not be limited to the contents described in the detailed description of the specification, but should also be defined by the claims.

What is claimed is:

1. A display device comprising:

a pixel circuit disposed on a base layer and including a transistor, the transistor including a source electrode, a drain electrode, a gate electrode, and a semiconductor layer; and a light emitting element electrically connected to the pixel circuit, wherein:

the semiconductor layer includes a low concentration area, a high concentration area, and a slope concentration area between the low concentration area and the high concentration area which are divided based on a concentration of a carrier and are spaced apart from each other in a length direction of the base layer, the low concentration area and a portion of the slope concentration area form a channel area, and form a source area and a drain area including the high concentration area and at least another portion of the slope concentration area, and the semiconductor layer in the slope concentration area satisfies Equation 1:

$$6.6 \le \frac{\Delta Y}{\Delta X} \le 11\ \left[1/(\mathrm{cm}^3 \cdot \mu\mathrm{m})\right] \quad \text{[Equation 1]}$$

where ΔX is a length change amount [μm] in a length direction of the semiconductor layer in the slope concentration area, and ΔY is a concentration change amount [$1/(\mathrm{cm}^3)$] of the carrier in the length change amount in the slope concentration area.

2. The display device according to claim 1, wherein the semiconductor layer is electrically connected to the source electrode in the source area, electrically connected to the drain electrode in the drain area, and overlaps the gate electrode in the slope concentration area in a plan view.

3. The display device according to claim 2, wherein:

at least a portion of the semiconductor layer does not overlap the gate electrode in the source area and the drain area in the plan view, and the semiconductor layer entirely overlaps the gate electrode in the slope concentration area in the plan view.

4. The display device according to claim 1, wherein the transistor includes a switching transistor.

5. The display device according to claim 1, wherein the semiconductor layer includes a thin film transistor including an oxide semiconductor.

6. The display device according to claim 5, wherein the oxide semiconductor includes In—Ga—Zn-Oxide (IGZO).

7. The display device according to claim 1, wherein the semiconductor layer in the slope concentration area satisfies Equation 2:

$$8600 \leq \frac{dC}{dV} \leq 10000 \quad \text{[Equation 2]}$$

where dC/dV is a differential value defined based on a capacitance change amount according to a change amount of a voltage measured in the slope concentration area of the semiconductor layer using a scanning capacitance microscope.

8. The display device according to claim 1, wherein a length of the slope concentration area in the length direction is in a range of about 0.05 μm to about 0.5 μm.

9. A display device comprising:

a pixel circuit disposed on a base layer and including a transistor, the transistor including a source electrode, a drain electrode, and a semiconductor layer; and a light emitting element electrically connected to the pixel circuit, wherein:

the semiconductor layer includes a low concentration area, a high concentration area, and a slope concentration area between the low concentration area and the high concentration area which are divided based on a concentration of a carrier and are spaced apart from each other in a length direction of the base layer, the low concentration area and a portion of the slope concentration area form a channel area, and form a source area and a drain area including the high concentration area and at least another portion the slope concentration area, and the semiconductor layer in the slope concentration area satisfies Equation 2:

$$8600 \leq \frac{dC}{dV} \leq 10000 \quad \text{[Equation 2]}$$

where dC/dV is a differential value defined based on a capacitance change amount according to a change amount of a voltage measured in the slope concentration area of the semiconductor layer using a scanning capacitance microscope.

10. A method of manufacturing a display device, the method comprising:

patterning a base semiconductor layer on a base layer; and forming semiconductor areas in the base semiconductor layer, wherein the forming of the semiconductor areas comprises:

defining the semiconductor areas;

analyzing a concentration of a carrier formed in the base semiconductor layer using a scanning capacitance microscope; and determining whether the concentration of the carrier satisfies a selectable reference, based on information on the analyzed concentration of the carrier, and the forming of the semiconductor areas further comprises further defining the semiconductor areas, in case that the concentration of the carrier does not satisfy the selectable reference;

wherein, the analyzing of the concentration of the carrier is performed after the determining whether the concentration of the carrier satisfies the selectable reference.

11. The method according to claim 10, wherein the analyzing of the concentration of the carrier comprises measuring dC/dV, by the scanning capacitance microscope, for each area of the base semiconductor layer, and dC/dV is obtained based on data measured for each area of the base semiconductor layer, and is a differential value defined based on a capacitance change amount according to a change amount of a voltage.

12. The method according to claim 10, wherein:

the defining of the semiconductor areas and the further defining of the semiconductor areas comprise performing an annealing process, and the annealing process is performed at a process temperature in a range of about 300° C. to about 650° C.

13. The method according to claim 10, wherein the base semiconductor layer includes an oxide semiconductor.

14. The method according to claim 10, wherein in case that the concentration of the carrier satisfies the selectable reference, patterning a source electrode and a drain electrode is performed without the further defining of the semiconductor areas.

15. The method according to claim 10, wherein:

the defining of the semiconductor areas comprises providing a dopant to the base semiconductor layer to provide a pre-updated-semiconductor layer, and the pre-updated-semiconductor layer includes a pre-updated-low concentration area, a pre-updated-high concentration area, and a pre-updated-slope concentration area between the pre-updated-low concentration area and the pre-updated-high concentration area which are divided based on the concentration of the carrier and are spaced apart in a length direction of the base layer.

16. The method according to claim 15, wherein the selectable reference is defined in the pre-updated-slope concentration area, and includes whether a slope indicating a change in the concentration of the carrier according to a change in a length of the pre-updated-semiconductor layer is greater than or equal to a selectable reference slope.

17. The method according to claim 16, wherein the selectable reference slope is about 6.6 or less.

18. The method according to claim 15, wherein the selectable reference includes whether a length of the pre-updated-slope concentration area in the length direction is less than or equal to a selectable reference length.

19. The method according to claim 18, wherein the selectable reference length is about 0.5 μm or less.

20. The method according to claim 10, further comprising:

providing a semiconductor layer satisfying the selectable reference wherein:

the semiconductor layer includes a low concentration area, a high concentration area, and a slope concentration area between the low concentration area and the high concentration area which are divided based on the concentration of the carrier and are spaced apart from each other in a length direction of the base layer, the low concentration area and a portion of the slope concentration area form a channel area, and form a source area and a drain area including the high concentration area and at least another portion of the slope concentration area, and the semiconductor layer in the slope concentration area satisfies Equation 1:

$$6.6 \leq \frac{\Delta Y}{\Delta X} \leq 11\ [1/(\mathrm{cm}^3 \cdot \mu\mathrm{m})] \quad \text{[Equation 1]}$$

where ΔX is a length change amount [μm] in the length direction of the semiconductor layer in the slope concentration area, and ΔY is a concentration change amount [1/($cm^3$)] of the carrier in the length change amount in the slope concentration area.

* * * * *